United States Patent
Hatsumi et al.

(10) Patent No.: US 11,631,708 B2
(45) Date of Patent: Apr. 18, 2023

(54) IMAGE PROCESSING METHOD, PROGRAM, AND IMAGING DEVICE

(71) Applicant: SEMICONDUCTOR ENERGY LABORATORY CO., LTD., Atsugi (JP)

(72) Inventors: Ryo Hatsumi, Kanagawa (JP); Taisuke Kamada, Saitama (JP); Daisuke Kubota, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 211 days.

(21) Appl. No.: 17/277,781

(22) PCT Filed: Sep. 17, 2019

(86) PCT No.: PCT/IB2019/057791
§ 371 (c)(1),
(2) Date: Mar. 19, 2021

(87) PCT Pub. No.: WO2020/065442
PCT Pub. Date: Apr. 2, 2020

(65) Prior Publication Data
US 2022/0344391 A1 Oct. 27, 2022

(30) Foreign Application Priority Data
Sep. 28, 2018 (JP) .............................. JP2018-183995

(51) Int. Cl.
*H01L 27/146* (2006.01)
*H04N 5/3745* (2011.01)

(52) U.S. Cl.
CPC .. *H01L 27/14609* (2013.01); *H01L 27/14605* (2013.01); *H04N 5/3745* (2013.01)

(58) Field of Classification Search
CPC ........ H01L 27/14609; H01L 27/14605; H04N 5/3745; H04N 5/232; H04N 5/349;
(Continued)

(56) References Cited

U.S. PATENT DOCUMENTS 8,644,376 B2    2/2014 Jiang et al.
9,319,578 B2    4/2016 Jiang et al.
(Continued)

FOREIGN PATENT DOCUMENTS

CN    102792151 A    11/2012
CN    104115484 A    10/2014
(Continued)

OTHER PUBLICATIONS

International Search Report (Application No. PCT/IB2019/057791) dated Nov. 26, 2019.
(Continued)

*Primary Examiner* — Tony Ko
(74) *Attorney, Agent, or Firm* — Fish & Richardson P.C.

(57) ABSTRACT

The structure of an imaging device is simplified. An imaging device capable of imaging without a lens or an image processing method is provided. Image data which is out of focus is sharpened. An image processing method of image data in which a plurality of pixels are arranged is provided. Adjacent two pixels are each divided into a first region showing the same pixel value between the adjacent two pixels and a second region other than the first region, an initial value is supplied to the second region of an endmost pixel of the image data, and the pixel values of the first regions and the second regions of the plurality of arranged pixels are determined inductively and sequentially on the basis of the initial value.

12 Claims, 23 Drawing Sheets

(58) Field of Classification Search
CPC ...... H04N 5/369; H04N 5/2253; H04N 5/347; G06T 1/00
See application file for complete search history.

(56) References Cited

U.S. PATENT DOCUMENTS

| | | | |
|---|---|---|---|
| 9,344,736 | B2 | 5/2016 | Jiang et al. |
| 9,407,884 | B2 | 8/2016 | Sugawara |
| 9,455,287 | B2 | 9/2016 | Kurokawa |
| 9,674,461 | B2 | 6/2017 | Aoki et al. |
| 9,743,020 | B2 | 8/2017 | Zheng et al. |
| 9,826,139 | B2 | 11/2017 | Fukuda |
| 9,881,954 | B2 | 1/2018 | Takahashi et al. |
| 10,284,797 | B2 | 5/2019 | Adachi et al. |
| 10,373,991 | B2 | 8/2019 | Ohmaru et al. |
| 10,739,573 | B2 | 8/2020 | Hayashi et al. |
| 2011/0234757 | A1 | 9/2011 | Zheng et al. |
| 2013/0201297 | A1 | 8/2013 | Jiang et al. |
| 2013/0201343 | A1 | 8/2013 | Jiang et al. |
| 2014/0112594 | A1 | 4/2014 | Jiang et al. |
| 2015/0248000 | A1 | 9/2015 | Hayashi et al. |
| 2015/0382026 | A1 | 12/2015 | Jiang et al. |
| 2016/0006916 | A1 | 1/2016 | Jiang et al. |
| 2016/0330389 | A1 | 11/2016 | Adachi et al. |
| 2016/0381266 | A1* | 12/2016 | Ohmaru ................. H04N 5/378 348/264 |
| 2019/0215473 | A1 | 7/2019 | Miyatani |
| 2020/0341252 | A1 | 10/2020 | Hayashi et al. |

FOREIGN PATENT DOCUMENTS

| | | |
|---|---|---|
| CN | 104662887 A | 5/2015 |
| CN | 104756478 A | 7/2015 |
| CN | 104813648 A | 7/2015 |
| CN | 105594197 A | 5/2016 |
| CN | 105794195 A | 7/2016 |
| CN | 109479101 A | 3/2019 |
| EP | 2550522 A | 1/2013 |
| EP | 2813070 A | 12/2014 |
| EP | 2881914 A | 6/2015 |
| EP | 2912837 A | 9/2015 |
| EP | 3214831 A | 9/2017 |
| EP | 3487165 A | 5/2019 |
| JP | 2011-119711 A | 6/2011 |
| JP | 2013-243355 A | 12/2013 |
| JP | 2015-510356 | 4/2015 |
| JP | 2016-500848 | 1/2016 |
| KR | 2014-0111025 A | 9/2014 |
| KR | 2015-0060846 A | 6/2015 |
| KR | 2019-0022619 A | 3/2019 |
| WO | WO-2011/119678 | 9/2011 |
| WO | WO-2012/044468 | 4/2012 |
| WO | WO-2013/119593 | 8/2013 |
| WO | WO-2014/045525 | 3/2014 |
| WO | WO-2014/046152 | 3/2014 |
| WO | WO-2014/066096 | 5/2014 |
| WO | WO-2015/200038 | 12/2015 |
| WO | WO-2016/003655 | 1/2016 |
| WO | WO-2016/067508 | 5/2016 |
| WO | WO-2018/012492 | 1/2018 |

OTHER PUBLICATIONS

Written Opinion (Application No. PCT/IB2019/057791) dated Nov. 26, 2019.
Tanaka. M et al., "Break the Pixel Number Barrier Super-Resolution Technology from Multiple Images", The Journal of the Institute of Image Information and Television Engineers, Mar. 1, 2008, vol. 62, No. 3, pp. 337-342.
Takanishi. A et al., "Research on Image Processing Method Using Fine Motion of Visual Sensor", Journal of JSPE, Oct. 10, 1995, vol. 61, No. 10, pp. 1480-1484.
Chinese Office Action (Application No. 201980063361.1) dated Sep. 6, 2022.

* cited by examiner

FIG. 8A

| $V_{A00}$ | $V_{A10}$ | $V_{A20}$ | $V_{A30}$ | | | | | $V_{Am0}$ |
|---|---|---|---|---|---|---|---|---|
| $V_{A01}$ | $V_{A11}$ | $V_{A21}$ | | | | | | $V_{Am1}$ |
| $V_{A02}$ | $V_{A12}$ | $V_{A22}$ | | | | | | $V_{Am2}$ |
| $V_{A03}$ | | | | | | | | |
| | | | | | | | | |
| $V_{A0n}$ | $V_{A1n}$ | $V_{A2n}$ | | | | | | $V_{Amn}$ |

| $V_{S00}$ | $V_{S10}$ | $V_{S20}$ | $V_{S30}$ | | | | | $V_{Sm0}$ |
|---|---|---|---|---|---|---|---|---|
| $V_{S01}$ | $V_{S11}$ | $V_{S21}$ | | | | | | $V_{Sm1}$ |
| $V_{S02}$ | $V_{S12}$ | $V_{S22}$ | | | | | | $V_{Sm2}$ |
| $V_{S03}$ | | | | | | | | |
| | | | | | | | | |
| $V_{S0n}$ | $V_{S1n}$ | $V_{S2n}$ | | | | | | $V_{Smn}$ |

$D_1$

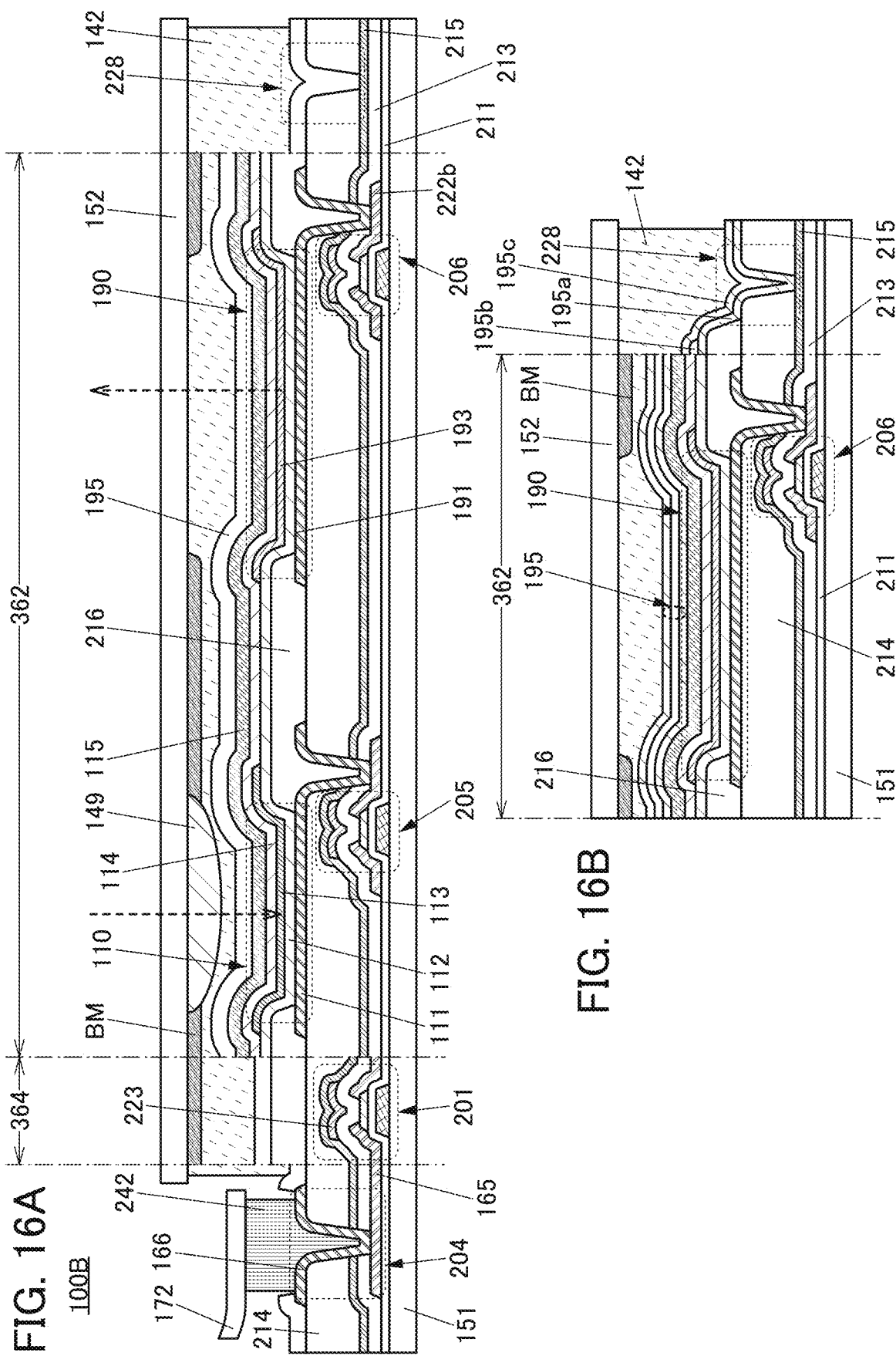

IMAGE PROCESSING METHOD, PROGRAM, AND IMAGING DEVICE

CROSS REFERENCE TO RELATED APPLICATIONS

This application is a U.S. National Phase Application under 35 U.S.C. § 371 of International Application PCT/IB2019/057791, filed on Sep. 17, 2019, which is incorporated by reference and claims the benefit of a foreign priority application filed in Japan on Sep. 28, 2018, as Application No. 2018-183995.

TECHNICAL FIELD

One embodiment of the present invention relates to image processing and a program related to image processing. One embodiment of the present invention relates to an imaging device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

Imaging devices have been mounted in devices such as digital cameras conventionally, and with the widespread use of portable information terminals such as smartphones and tablet terminals, an improvement in performance, a reduction in size, and a reduction in costs have been needed. Moreover, imaging devices have been not only used for taking a photograph or a moving image but also applied to biological authentication such as face authentication or fingerprint authentication or input devices such as touch sensors or motion sensors, for example; that is, the usage has been diversified.

Furthermore, the performance and the number of functions of imaging devices have been increased. Patent Document 1 discloses, for example, an imaging device in which a transistor including an oxide semiconductor and having an extremely low off-state current is used in part of a pixel circuit and a transistor including silicon with which a CMOS (Complementary Metal Oxide Semiconductor) circuit can be formed is used in a peripheral circuit.

Patent Document 2 discloses an imaging device in which a transistor including silicon, a transistor including an oxide semiconductor, and a photodiode including a crystalline silicon layer are stacked.

REFERENCE

Patent Document

[Patent Document 1] Japanese Published Patent Application No. 2011-119711
[Patent Document 2] Japanese Published Patent Application No. 2013-243355

SUMMARY OF THE INVENTION

Problems to be Solved by the Invention

In an imaging device, light is converted into an electric signal by an imaging module (also referred to as an image sensor or the like) in which pixel circuits each including a photoelectric conversion element are arranged in a matrix, whereby image data can be generated. In that case, optical members such as a lens were necessarily used in combination for taking a clear image of a subject. Thus, there was a problem of difficulty in reducing the cost of an imaging device and downsizing an imaging device. Moreover, since the performance of an imaging device depends on not only an imaging module but also the optical performance of a lens or the like, there is also a problem of large development costs.

An object of one embodiment of the present invention is to simplify a structure of an imaging device. Another object is to provide an imaging device capable of imaging without a lens. Another object is to provide an image processing method that enables imaging without a lens. Another object is to sharpen image data which is out of focus. Another object is to provide an imaging device or an electronic device employing the above image processing method.

Note that the description of these objects does not preclude the existence of other objects. One embodiment of the present invention does not have to achieve all these objects. Note that objects other than these can be derived from the descriptions of the specification, the drawings, the claims, and the like.

Means for Solving the Problems

One embodiment of the present invention is an image processing method of image data in which a plurality of pixels are arranged, adjacent two pixels are each divided into a first region showing the same pixel value between the adjacent two pixels and a second region other than the first region, an initial value is supplied to the second region of an endmost pixel of the image data, and the pixel values of the first regions and the second regions of the plurality of arranged pixels are determined inductively and sequentially on the basis of the initial value.

Another embodiment of the present invention is an image processing method of image data in which a plurality of pixels are arranged in a matrix, 2×2 pixels are each divided into a first region showing the same pixel value as a pixel value of an adjacent pixel and a second region other than the first region, initial values are supplied to the second regions of three outermost pixels of 2×2 endmost pixels of the image data, and the pixel values of the first region and the second region of one residual pixel are determined on the basis of the initial values, and the pixel values of the first regions and the second regions of the plurality of arranged pixels are determined inductively and sequentially on the basis of the determined pixel values of the first region and the second region.

Another embodiment of the present invention is an image processing method of image data in which a plurality of pixels are arranged. The image data includes an endmost first pixel including a first pixel value and a second pixel adjacent to the first pixel and including a second pixel value. The first pixel is divided into a first region including a third pixel value and a second region including a fourth pixel value, the second pixel is divided into a third region including a fifth pixel value and the second region, and an initial value is applied to the third pixel value, whereby the fifth pixel value is determined using the first pixel value, the second pixel value, and the third pixel value.

In the above, the image data preferably includes a third pixel adjacent to the second pixel and including a sixth pixel value. In the image processing method, it is preferable that the second pixel be divided into a fourth region including a seventh pixel value and a fifth region including an eighth pixel value, the third pixel be divided into a sixth region including a ninth pixel value and the fifth region, the fourth pixel value be determined using the first pixel value, the second pixel value, and the third pixel value, and the ninth pixel value be determined using the second pixel value, the fourth pixel value, the fifth pixel value, and the sixth pixel value.

Another embodiment of the present invention is a program executed by a computer and including a step of reading out image data in which a plurality of pixels are arranged; a step of dividing each of adjacent two pixels into a first region showing the same pixel value between the adjacent two pixels and a second region other than the first region; a step of supplying an initial value to the second region of an endmost pixel of the image data; and a step of inductively and sequentially determining the pixel values of the first regions and the second regions of the plurality of arranged pixels on the basis of the initial value.

Another embodiment of the present invention is a program executed by a computer and including a step of reading out image data in which a plurality of pixels are arranged in a matrix; a step of dividing each of 2×2 pixels into a first region showing the same pixel value as a pixel value of an adjacent pixel and a second region other than the first region; a step of supplying initial values to the second regions of three outermost pixels of 2×2 endmost pixels of the image data; a step of determining the pixel values of the first region and the second region of one residual pixel on the basis of the initial values; and a step of inductively and sequentially determining the pixel values of the first regions and the second regions of the plurality of arranged pixels on the basis of the determined pixel values of the first region and the second region.

Another embodiment of the present invention is a program executed by a computer and including a step of reading out image data in which a plurality of pixels are arranged, and the image data includes an endmost first pixel including a first pixel value and a second pixel adjacent to the first pixel and including a second pixel value; a step of dividing the first pixel into a first region including a third pixel value and a second region including a fourth pixel value; a step of dividing wherein the second pixel is divided into a third region including a fifth pixel value and the second region; a step of applying an initial value to the third pixel value; and a step of determining the fifth pixel value from the first pixel value, the second pixel value, and the third pixel value.

In the above program, the image data preferably includes a third pixel adjacent to the second pixel and including a sixth pixel value, and a step of dividing the second pixel into a fourth region including a seventh pixel value and a fifth region including an eighth pixel value; a step of dividing the third pixel into a sixth region including a ninth pixel value and the fifth region; a step of determining the fourth pixel value from the first pixel value, the second pixel value, and the third pixel value; and a step of determining the ninth pixel value from the second pixel value, the fourth pixel value, the fifth pixel value, and the sixth pixel value are preferably included.

Another embodiment of the present invention is an imaging device including a memory portion storing any one of the above-described programs; a control portion for executing the program; and an imaging portion for obtaining the image data. The imaging portion includes a plurality of pixel circuits for obtaining pixel values corresponding to pixels, and the imaging ranges of two adjacent pixel circuits among the plurality of pixel circuits partly overlap with each other.

Effect of the Invention

According to one embodiment of the present invention, a structure of an imaging device can be simplified. Alternatively, an imaging device capable of imaging without a lens can be provided. Alternatively, an image processing method that enables imaging without a lens can be provided. Alternatively, image data which is out of focus can be sharpened. Alternatively, an imaging device or an electronic device employing the above image processing method can be provided.

Note that the description of these effects does not preclude the existence of other effects. One embodiment of the present invention does not necessarily need to have all these effects. Note that effects other than these can be derived from the descriptions of the specification, the drawings, the claims, and the like.

BRIEF DESCRIPTION OF THE DRAWINGS

FIG. 8A and FIG. 8B are diagrams illustrating an image processing method.

FIG. 16A and FIG. 16B are cross-sectional views showing an example of a display device.

MODE FOR CARRYING OUT THE INVENTION

Figure 1A:
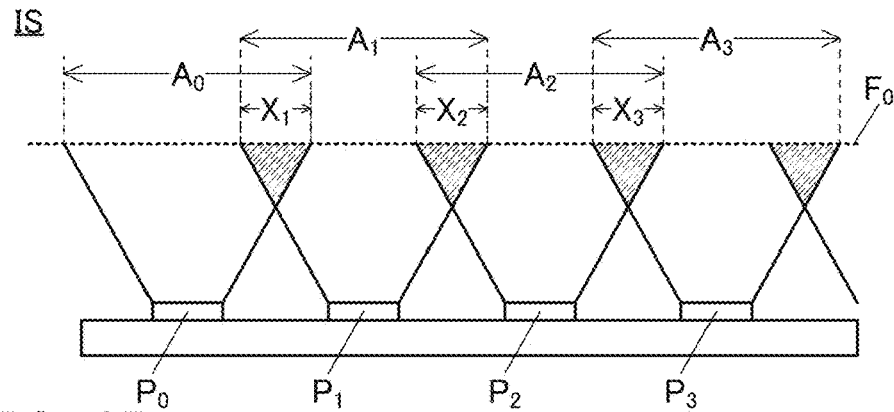
FIG. 1A is a structure example of an imaging module.

Embodiments will be described below with reference to the drawings. Note that the embodiments can be implemented with many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Thus, they are not limited to the shown scale.

Note that in this specification and the like, the ordinal numbers such as "first" and "second" are used in order to avoid confusion among components and do not limit the number.

Embodiment 1

In this embodiment, an image processing method, a program, and an imaging device of embodiments of the present invention will be described.

When an image of a subject is taken by an imaging module in which a plurality of pixel circuits including photoelectric conversion elements (hereinafter, also referred to as imaging elements) are arranged in a matrix, light enters the imaging module from various directions unless a special optical system such as a lens or a lens array is used. Therefore, an imaging range per imaging element is widely expanded compared to the case of using an optical system. Here, when the distance between two imaging elements is short, the imaging ranges thereof overlap with each other and thus a blurred image is taken. In other words, an image which is out of focus is taken.

Here, an image taken by the imaging module can be regarded as image data. The image data is preferably multi-tone bitmap image data or image data of a similar image file format. Such image data can be regarded as arrangement information of pixels assigned data including information such as color, gradation, or luminance (hereinafter, referred to as a pixel value). For example, the number of pixels of image data corresponding to full-high-definition image quality is 1920×1080, and a gray level value having 8 bits for each of R, G, and B, e.g., 24 bits in total is allocated as the pixel value of one pixel.

When imaging is performed without using a special optical system as described above, two adjacent imaging elements of the imaging module obtain luminance information of substantially the same portion of a subject. Therefore, information included in a pixel value obtained by one imaging element overlaps with information in a pixel value obtained by the adjacent other imaging element. In addition, in image data obtained by the imaging module, the proportion of information that is included in the pixel value of one pixel and overlaps with information of the adjacent other pixel is proportional to the proportion of a region where the imaging ranges of the two adjacent imaging elements of the imaging module overlap with each other.

In view of the above, two pixels including adjacent image data are each divided into a first region and a second region that are described below. The first region corresponds to a region including information overlapping with that of an adjacent pixel, and is a region having a pixel value that is the same between the two adjacent pixels. The second region is a region other than the first region, and the pixel value of the second region can be different between two adjacent pixels. The pixel value of one pixel is equal to the sum of the pixel value of the first region and the pixel value of the second region.

In such a manner, the first region that includes information overlapping between two pixels including adjacent image data and makes an image blurred and the second region other than the first region can be separately handled. Using the pixel values of the two regions, clear image data can be newly generated.

Here, for simplicity, single-dimensional image data arranged in one direction is described as an example. First, two adjacent pixels of original image data are a pixel A0 and a pixel B0, and two adjacent pixels of corrected image data are a pixel A1 and a pixel B1.

In this case, the pixel value of the second region is used as the pixel value of each of the pixel A1 and the pixel B1 of the corrected image data, whereby a cause of a blur is eliminated and thus a sharpened image can be obtained.

Alternatively, when a value obtained by adding the pixel value of the first region to the pixel value of the second region is used as the pixel value of the pixel A1 of the corrected image data, the maximum pixel value that the pixel A1 can have can be inhibited from decreasing from the pixel value of the original pixel A0. In this case, as the pixel value of the pixel B1, a value obtained by adding the pixel value of the first region that is defined in a similar manner between the pixel B0 and an adjacent pixel C0 and the pixel value of the second region.

The pixel values of the first region and the second region of each pixel of the above-described image data can be determined by an inductive method. In other words, when an initial value is supplied to the second region of an endmost pixel of the image data, the pixel values of the first region and the second region of an adjacent pixel can be determined by an inductive method.

Moreover, the above-described method can be employed for two-dimensionally arranged image data. When one pixel of given 2×2 pixels of original image data is focused on, for example, the one pixel can be divided into a first region overlapping with any one of a pixel adjacent in the lateral direction, a pixel adjacent in the longitudinal direction, and a pixel adjacent in the oblique direction and a second region overlapping with none of the pixels.

Then, when initial values are supplied to three outermost pixels of 2×2 endmost pixels of the image data, the pixel values of the first region and the second region of one residual pixel can be determined by an inductive method. Accordingly, sharpened image data can be generated.

More specific examples are described below with reference to drawings.

Example 1

[Imaging Module]

FIG. 1A shows a schematic view of an imaging module IS. The imaging module IS includes a plurality of imaging elements $P_i$ arranged at regular intervals (i is an integer greater than or equal to 0). FIG. 1A illustrates an imaging element $P_0$, an imaging element $P_1$, an imaging element $P_2$, and an imaging element $P_3$. Here, the imaging element $P_0$ is an endmost imaging element. The imaging elements each include at least one photoelectric conversion element and a pixel circuit that controls the photoelectric conversion element.

The imaging element $P_0$ can receive light entering from a region $A_0$, convert the light into an electric signal, and output the electric signal. That is, the region $A_0$ corresponds to the imaging range of the imaging element $P_0$. Similarly, regions $A_1$, $A_2$, and $A_3$ correspond to the imaging ranges of the imaging elements $P_1$, $P_2$, and $P_3$, respectively.

In FIG. 1A, an imaging plane $F_0$ is indicated by a dashed line. The imaging plane $F_0$ is a plane parallel to a surface of the imaging module IS and positioned at the predetermined height from the surface. The imaging plane $F_0$ is a plane corresponding to a virtual focal plane in image processing, and the image processing can reduce a blur of a subject in a portion positioned at the imaging plane $F_0$. The imaging plane $F_0$ can be arbitrarily set by a practitioner in accordance with the structure and the usage of the imaging module IS. In the case of using the imaging module IS for usage such as an optical touch sensor, fingerprint authentication, or the like, the contact surface of a subject (e.g., a finger) corresponds to the imaging plane $F_0$.

The region $A_0$ and the region $A_1$ partly overlap with each other in a portion intersecting the imaging plane $F_0$. Here, a region on the imaging plane $F_0$ where the region $A_0$ and the region $A_1$ overlap with each other is a region $X_1$. Similarly, a region where the region $A_1$ and the region $A_2$ overlap with each other is a region $X_2$ and a region where the region $A2$ and the region $A_3$ overlap with each other is a region $X_3$. When the region $A_0$ and the region $A_1$ are focused on, the region $X_1$ positioned on the imaging plane $F_0$ can be referred to as a region where both of the imaging element $P_0$ and the imaging element $P_1$ perform imaging.

[Image Processing Method Example]

Figure 1B:
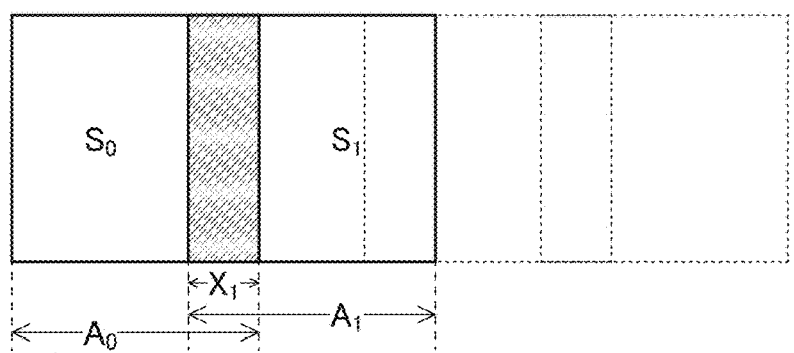
FIG. 1B to FIG. 1D are diagrams illustrating an image processing method.

FIG. 1B is a diagram illustrating the region $A_0$, the region $A_1$, and the region $X_1$ on the imaging plane $F_0$. In addition, the imaging regions of other imaging elements are indicated by dashed lines in FIG. 1B. Here, a portion other than the region $X_1$ in the region $A_0$ is a region $S_0$. Similarly, a portion other than the region $X_1$ in the region $A_1$ is a region $S_1$.

A pixel value corresponding to the total amount of light received by the imaging element $P_0$, i.e., a pixel value corresponding to the amount of light entering from the region $A_0$ is $V_{A0}$. A pixel value corresponding to light entering the imaging element $P_0$ from the region $X_1$ is $V_{X1}$, and a pixel value corresponding to light entering the imaging element $P_0$ from the region $S_0$ is $V_{S0}$. A pixel value corresponding to the total amount of light entering the imaging element $P_1$ from the region $A_1$ is $V_{A1}$, and a pixel value corresponding to light entering the imaging element $P_1$ from the region $S_1$ is $V_{S1}$. A pixel value corresponding to light entering the imaging element $P_1$ from the region $X_1$ is equal to $V_{X1}$ described above. According to these relations, $V_{A0}$ and $V_{A1}$ satisfy Formulae (1) below.

[Formulae 1]

$$V_{A0} = V_{S0} + V_{X1}$$

$$V_{A1} = V_{S1} + V_{X1} \tag{1}$$

Here, light entering the imaging element $P_0$ from the region $S_0$ not overlapping with the region $A_1$ in the endmost region $A_0$ has a known value. In other words, the pixel value $V_{S0}$ corresponding to the region $S_0$ can be regarded as a known value.

In the case of application to the above-described optical touch sensor or fingerprint authentication, for example, light reflected by an object such as a finger is obtained; thus, the outside of a fingertip whose image is to be taken is a black or monochromatic background color in many cases. Therefore, when an image of an object is correctly taken, an endmost imaging element always takes an image of a background color, and thus the background color can be used as a known value. Without limitation to this, in the case of usage of imaging under always similar conditions such as a fixed point camera or various optical sensors, an endmost pixel of obtained image data can always have the same pixel value, and thus the pixel value can be used as a known value. In the case of usage of imaging under always different conditions, a monochromatic filter such as a black filter is positioned over the imaging region of the endmost imaging element, so that the condition where the pixel value of the endmost pixel is a known value can be intentionally made.

In such a manner, a known value is applied to $V_{S0}$ as an initial value, and $V_{A0}$ and $V_{A1}$ are pixel values of original image data, so that $V_{S1}$ and $V_{X1}$ can be determined by modifying Formulae (1) above (see Formulae (2) below).

[Formulae 2]

$$V_{S1} = V_{A1} - V_{A0} + V_{S0}$$

$$V_{X1} = V_{A0} - V_{S0} \tag{2}$$

Figure 1C:
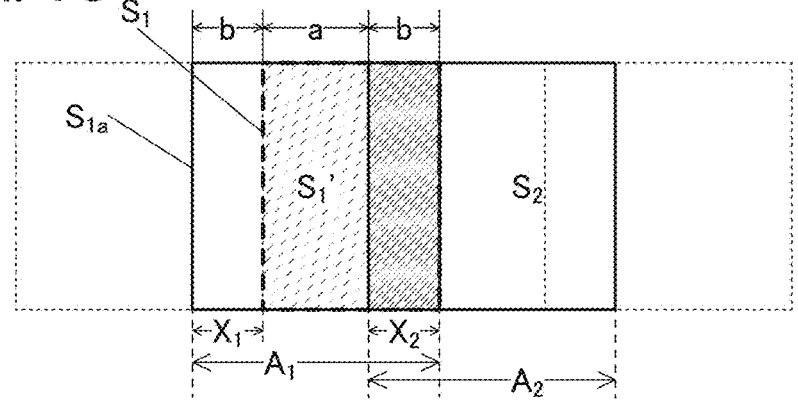

Next, the region $A_1$, the region $A_2$, and the region $X_2$ are illustrated in FIG. 1C. A portion other than the region $X_2$ in the region $A_1$ is a region $S_{1a}$. A portion other than the region $X_2$ in the region $A_2$ is a region $S_2$. In FIG. 1C, the region $S_1$ is indicated by a dashed line. In this case, as described above, $V_{A1}$ and $V_{A2}$ satisfy Formulae (3) below.

[Formulae 3]

$$V_{A1} = V_{S1a} + V_{X2}$$

$$V_{A2} = V_{S2} + V_{X2} \tag{3}$$

Here, a region $S_1'$ in FIG. 1C corresponds to a region obtained by removing the region $X_1$ and the region $X_2$ from the region $A_1$. The region $S_1'$ is also part of the region $S_1$. Since the width of the region $S_1$ is equal to the maximum resolution of the imaging module IS (i.e., the arrangement pitch of imaging elements), even when luminance is distributed in the region $S_1$, it cannot be determined. Therefore, luminance distribution in the region $S_1$ can be considered uniform. Thus, a pixel value $V_{S1'}$ of the region $S_1'$ can be regarded as a value obtained by multiplying the pixel value $V_{S1}$ of the region $S_1$ by the proportion of the area.

As illustrated in FIG. 1C, when the width of the region $S_1'$ is a and the widths of the region $X_1$ and the region $X_2$ are each b (a and b are values satisfying a+b=1, a>0, and b>0), the pixel value $V_{S1'}$ of the region $S_1'$ is a value obtained by multiplying the pixel value $V_{S1}$ by a (a×$V_{S1}$). Note that a and b are values determined by the structure of the imaging module IS and the position of the imaging plane $F_0$, and are known values. Therefore, a pixel value $V_{S1a}$ of the region $S_{1a}$ is expressed by Formula (4).

[Formula 4]

$$V_{S1a} = aV_{S1} + V_{X1} \quad (4)$$

By substituting it for Formulae (3), a pixel value $V_{S2}$ of the region $S_2$ and a pixel value $V_{X2}$ of the region $X_2$ can be determined as in Formulae (5) below.

[Formulae 5]

$$V_{S2} = V_{A2} - V_{A1} + aV_{S1} + V_{X1}$$

$$V_{X2} = V_{A1} - aV_{S1} + V_{X1} \quad (5)$$

Figure 1D:
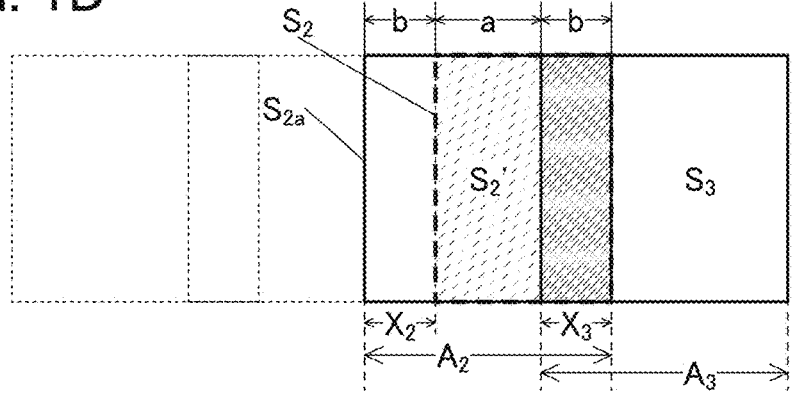

Next, FIG. 1D illustrates the region $A_2$, the region $A_3$, and the region $X_3$. A pixel value $V_{S3}$ and a pixel value $V_{X3}$ of the region $S_3$ and the region $X_3$ that are illustrated here can be determined by a method similar to the above, and are values expressed by Formulae (6).

[Formulae 6]

$$V_{S3} = V_{A3} - V_{A2} + aV_{S2} + V_{X2}$$

$$V_{X3} = V_{A2} - aV_{S2} + V_{X2} \quad (6)$$

That is, Formulae (6) are expressed by general formulae like Formulae (7).

[Formulae 7]

$$V_{Sj+1} = V_{Aj+1} - V_{Aj} + aV_{Sj} + V_{Xj}$$

$$V_{Xj+1} = V_{Aj} - aV_{Sj} + V_{Xj} \quad (7)$$

In Formulae (7) above, in the case of image data in which n+1 pixels are arranged, j is an integer greater than or equal to 0 and less than or equal to n. As expressed by Formulae (7) above, a known value is applied to the pixel value $V_{S0}$ of the region $S_0$ as an initial value, whereby the pixel values of overlapping regions and the pixel values of other regions of all the pixels can be inductively determined.

[Corrected Image Data]

Using a pixel value calculated as described above, new image data that is sharpened and less blurred can be generated.

Figure 2A:
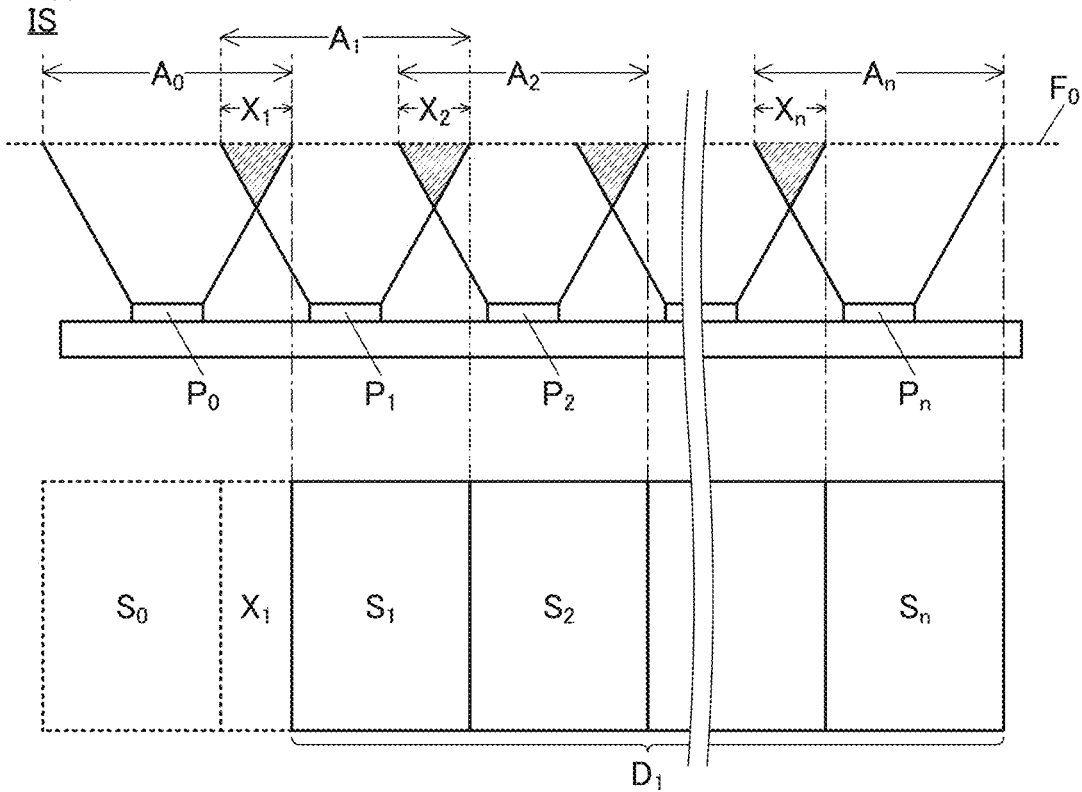
FIG. 2A and FIG. 2B are diagrams illustrating an image processing method.

FIG. 2A is a diagram schematically illustrating the relation between the imaging range of the imaging module IS and corrected image data $D_1$.

The newly-generated image data $D_1$ is image data corresponding to n regions from the region $S_1$ calculated above to a region $S_n$. More specifically, the image data can include n pixel values from the pixel value $V_{S1}$ to a pixel value $V_{Sn}$.

As illustrated in FIG. 2A, a pixel value corresponding to the amount of light obtained by subtracting the amount of light received from the region $X_1$ from the total amount of light received by the imaging element $P_1$ corresponds to the pixel value of an endmost pixel of the new image data $D_1$ (i.e., the pixel value $V_{S1}$). The pixel value of an adjacent pixel is the pixel value $V_{S2}$ corresponding to the amount of light obtained by subtracting the amount of light received from the region $X_2$ from the total amount of light received by the imaging element $P_2$. In this manner, information from overlapping regions is allocated to one pixel and removed from the other pixel, whereby image data not including information overlapping between the two pixels can be generated. As a result, less blurred and clearer image data can be generated.

Figure 2B:
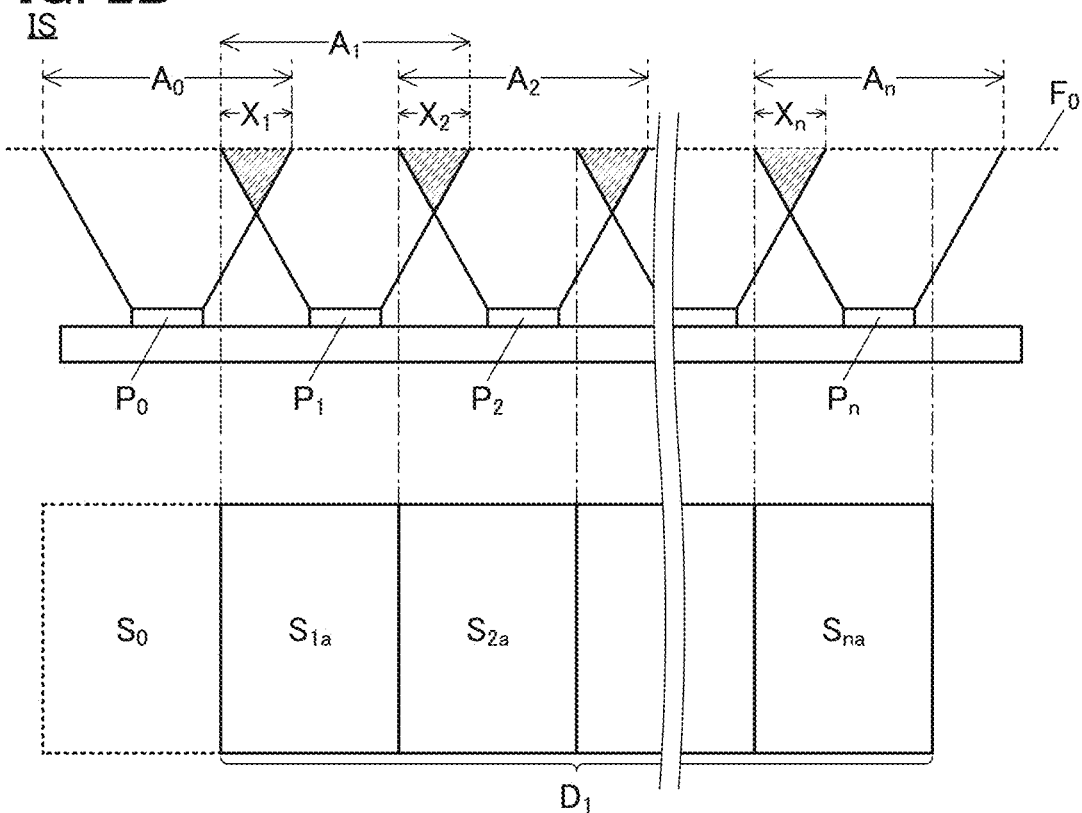

Note that as illustrated in FIG. 2B, image data can correspond to n regions from the region $S_{1a}$ calculated above to a region $S_{na}$. That is, the data can include n pixel values from the pixel value $V_{S1a}$ to a pixel value $V_{Sna}$.

Modification Example 1

Although the above is the description about the case where the imaging range of one imaging element overlaps with only an adjacent imaging element when the one imaging element is focused on, the imaging range of one imaging element may overlap with an imaging element second or more from the one imaging element, depending on the position of the imaging plane $F_0$ or the structure of the imaging module IS.

Figure 3A:
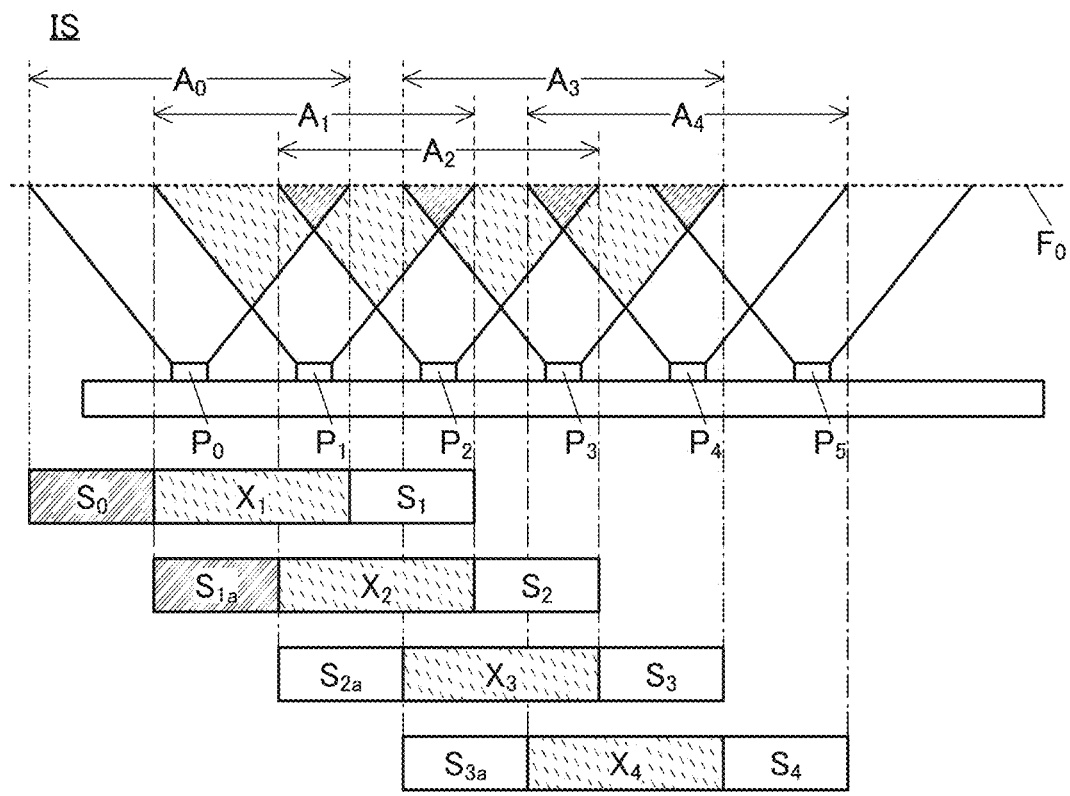
FIG. 3A and FIG. 3B are diagrams illustrating an image processing method.

FIG. 3A shows a schematic view of the case where the imaging range of one imaging element overlaps with an imaging element second from the one imaging element. The upper part of FIG. 3A schematically illustrates the imaging module IS and the imaging ranges of imaging elements. The lower part of FIG. 3A schematically illustrates imaging ranges per two adjacent imaging elements. Here, in each region, the scale in the longitudinal direction is illustrated to be smaller than that in the lateral direction.

First, the pixel value $V_{S1}$ and the pixel value $V_{X1}$ of the region $S_1$ and the region $X_1$ that are illustrated in FIG. 3A can be determined in the above-described manner when the pixel value $V_{S0}$ of the region $S_0$ is supplied as an initial value. However, when the next two imaging elements (the imaging elements $P_1$ and $P_2$) are focused on, since the region $S_{1a}$ and the region $S_1$ whose pixel value is determined above do not overlap with each other, the pixel value of the region $S_{1a}$ cannot be determined.

In view of this, not only the region $S_0$ but also the region $S_{1a}$ is supplied with an initial value as known information. That is, the pixel value $V_{S1a}$ of the region $S_{1a}$ is also a known value. In such a manner, the pixel value $V_{S2}$ of the region $S_2$ and the pixel value $V_{X2}$ of the region $X_2$ are determined.

Next, considering a region $S_{2a}$, the region $X_3$, and the region $S_3$ of the next two imaging elements (the imaging elements $P_2$ and $P_3$), when the region 52a is supplied with a pixel value, the pixel values of the region $S_3$ and the region $X_3$ can be determined.

Figure 3B:
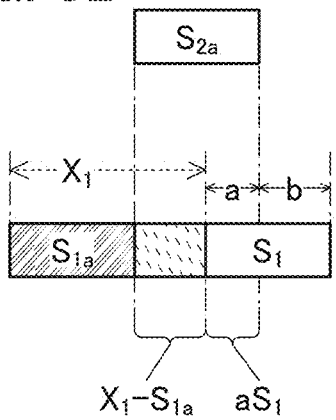

The region $S_{2a}$ can be expressed using the region $X_1$, the region $S_{1a}$, and the region $S_1$. FIG. 3B schematically shows the relation between the region $S_{2a}$, the region $X_1$, the region $S_{1a}$, and the region $S_1$. As illustrated in FIG. 3B, the region $S_{2a}$ is equal to a region obtained by adding a remaining region obtained by removing the region $S_{1a}$ from the region $X_1$ (a region $X_1$-$S_{1a}$) to a region obtained by multiplying the region $S_1$ by a (a region $aS_1$) (a is a real number satisfying 0<a<1). Similarly, a pixel value $V_{S2a}$ of the region $S_{2a}$ can be determined using the pixel values of the region $X_1$, the region $S_{1a}$, and the region $S_1$.

Using the pixel value of the region 52a that is determined in such a manner, the pixel values of the region $S_3$ and the region $X_3$ illustrated in FIG. 3A can be determined.

In addition, the pixel values of a region $S_{3a}$, a region $X_4$, and a region $S_4$ of the next two imaging elements (the imaging elements $P_3$ and $P_4$) can also be determined in a similar manner.

As described above, when the imaging range of one imaging element overlaps with the imaging range of an imaging element second from the one imaging element, a known value is supplied to each of two endmost pixels as an initial value, whereby the pixel values of the overlapping regions and the pixel values of other regions of all the pixels can be inductively determined.

Although not shown here, image correction can be performed in a similar manner even when the imaging range of one imaging element overlaps with the imaging range of an imaging element third or more from the one imaging element. In other words, in the case where the imaging range of one imaging element overlaps with the imaging range of an imaging element qth from the one imaging element (q is an integer greater than or equal to 1), a known value is supplied to each of q endmost pixels of image data as an initial value, whereby the pixel values of the overlapping regions and the pixel values of other regions of all the pixels can be inductively determined.

Modification Example 2

In particular, when the width of the imaging range of an imaging element is an integral multiple of the arrangement pitch of imaging elements, a pixel value can be determined particularly easily.

Figure 4A:
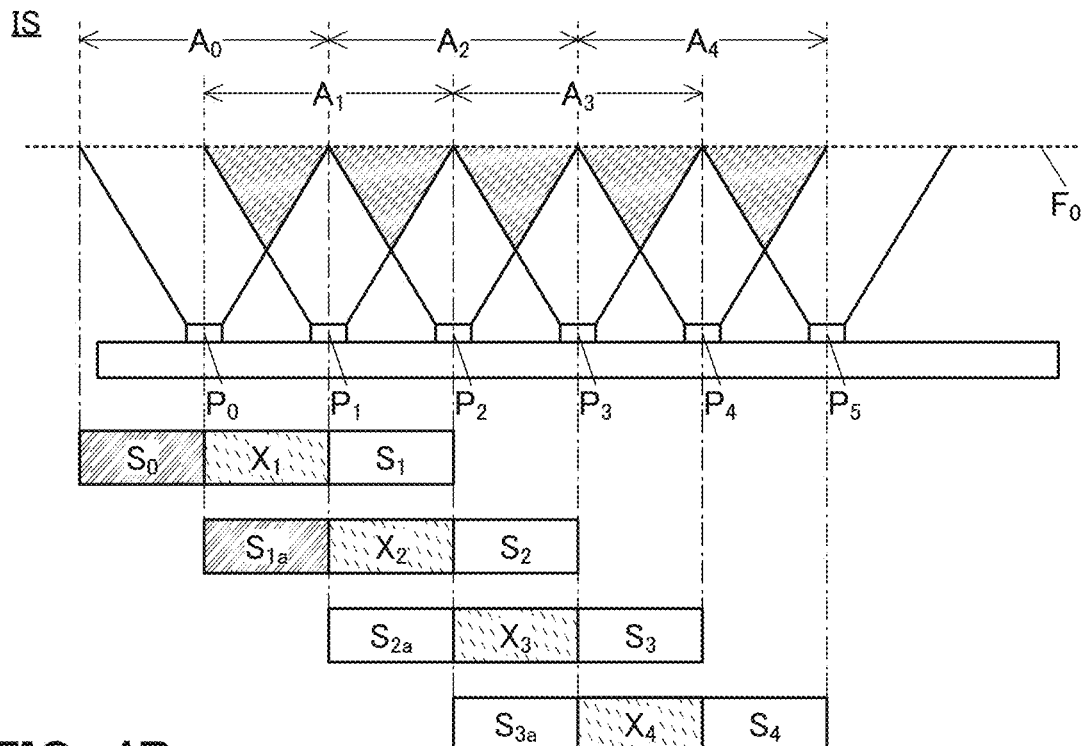
FIG. 4A and FIG. 4B are diagrams illustrating an image processing method.

FIG. 4A shows the case where the width of the imaging range of one imaging element is twice the arrangement pitch of imaging elements. In this case, when two imaging regions are focused on, the width of a region where the two imaging regions overlap with each other (e.g., the region $X_1$) is equal to the width of a region where the two imaging regions do not overlap with each other (e.g., the region $S_0$ and the region $S_1$).

Here, as illustrated in FIG. 4A, the region $S_1$ in the region $A_1$ and the region $S_2a$ in the region $A_2$ correspond to the same range. Therefore, the pixel value $V_{S2a}$ of the region $S_2a$ is equal to the pixel value $V_{S1}$ of the region $S_1$. Thus, when an initial value is applied to the pixel value of the region $S_0$ to obtain the pixel value $V_{S1}$ of the region $S_1$, the pixel value $V_{S3}$ of the region $S_3$ can be determined using the pixel value $V_{S1}$.

Similarly, the region $S_2$ in the region $A_2$ and the region $S_{3a}$ in the region $A_3$ have the same pixel value, so that when an initial value is applied to the pixel value of the region $S_{1a}$, the pixel value of the region $S_2$ is determined and then the pixel value of the region $S_4$ can be determined.

In other words, in the case where the width of the imaging range of one imaging element is twice the arrangement pitch of imaging elements, when the pixel value of a region S, of a region $A_i$ is determined, the pixel value of a region $S_{i+2}$ of a region $A_{i+2}$ second from the region $A_i$ can be inductively determined.

Figure 4B:
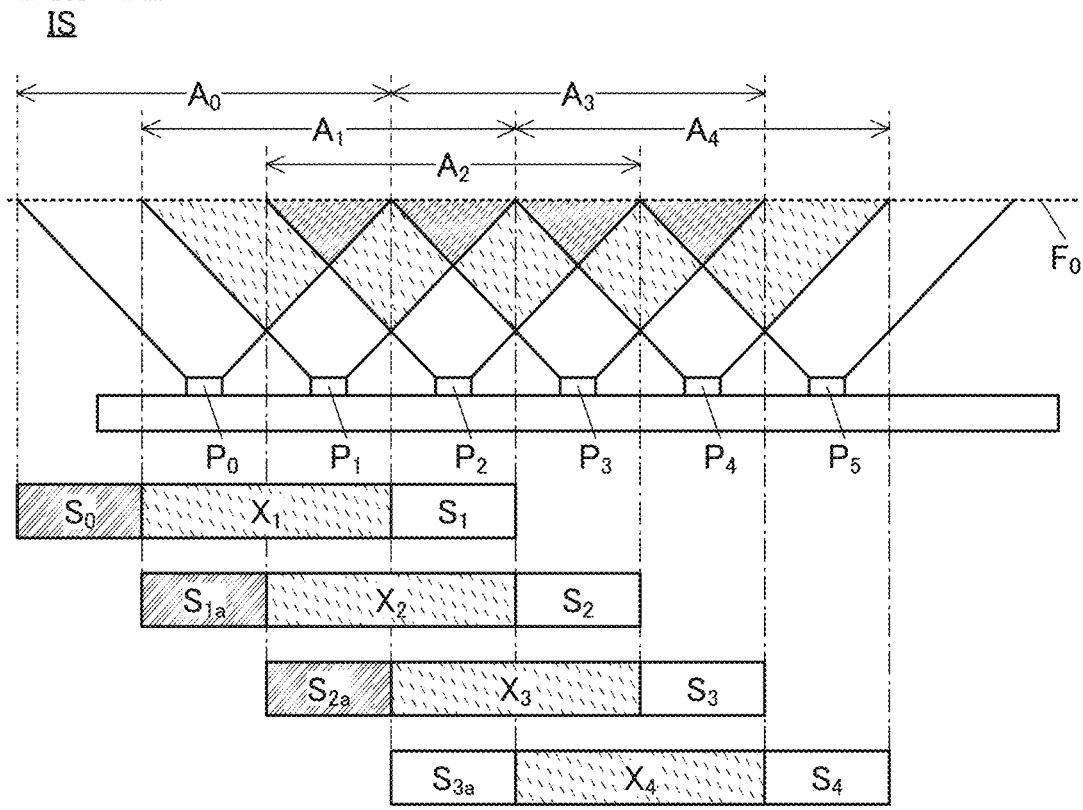

FIG. 4B shows the case where the width of the imaging range of one imaging element is three times the arrangement pitch of imaging elements.

In this case, the region $S_1$ in the region $A_1$ and the region $S_{3a}$ in the region $A_3$ correspond to the same range and the pixel values thereof are equal. Thus, when the pixel value $V_{S1}$ of the region $S_1$ is obtained by supplying an initial value to the pixel value of the region $S_0$, the pixel value $V_{S4}$ of the region $S_4$ can be determined using the pixel value $V_{S1}$.

In other words, in the case where the width of the imaging range of one imaging element is three times the arrangement pitch of imaging elements, when the pixel value of the region $S_i$ of the region $A_i$ is determined, the pixel value of a region $S_{i+3}$ of a region $A_{+3}$ third from the region $A_i$ can be inductively determined.

In general, in the case where the width of the imaging range of one imaging element is z times the arrangement pitch of imaging elements (z is an integer greater than or equal to 1), when the pixel value of the region S of the region $A_i$ is determined, the pixel value of a region $S_{i+z}$ of a region $A_{i+z}$ zth from the region $A_i$ can be inductively determined.

As described above, when the width of the imaging range of one imaging element is an integral multiple of the arrangement pitch of imaging elements, it is not necessary to obtain the pixel value of a region where the imaging ranges of two imaging elements overlap with each other (e.g., $X_1$), so that the calculation amount can be significantly reduced compared to Example 1 or Modification example 1 above.

Example 2

In Example 1 above, image data including single-dimensionally arranged pixels is described; hereinafter, an example of the case where it is applied to image data including second-dimensionally arranged data will be described. Note that Example 1 is referred to for the same portions as those in Example 1 such as preconditions or a calculation method, and the description of the same portions is omitted in some cases.

[Example of Imaging Module]

Figure 5A:
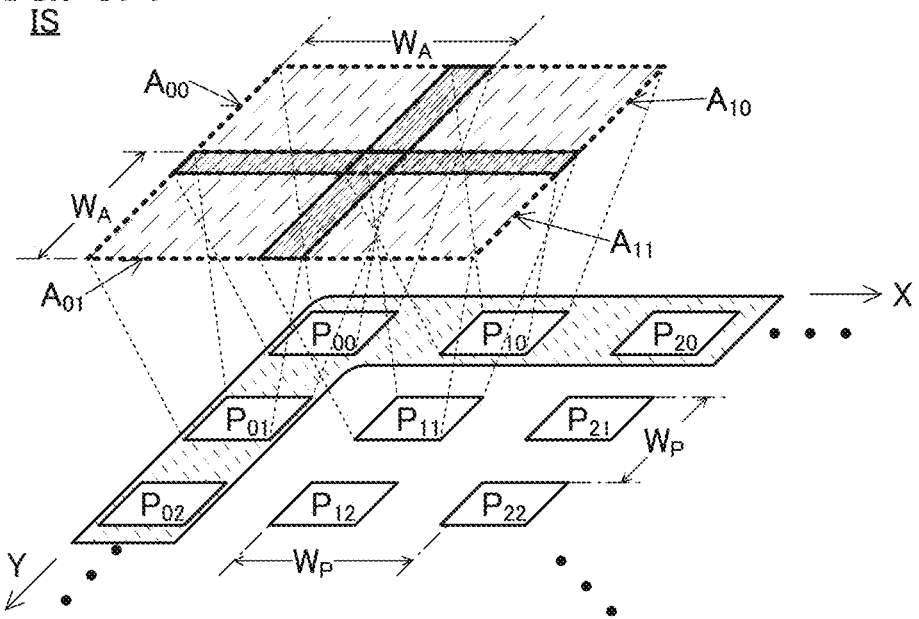
FIG. 5A and FIG. 5B illustrate a structure example of an imaging module.

FIG. 5A shows a schematic perspective view of the imaging module IS. In the imaging module IS, a plurality of imaging elements $P_{ij}$ (i and j are each an integer greater than or equal to 0) are arranged in the X direction and the Y direction in a matrix. An imaging element $P_{00}$ is an imaging element positioned at the very end (a corner portion) of a display region of the imaging module IS. An imaging element $P_{0j}$ and an imaging element $P_{i0}$ are outermost imaging elements of the display region.

Figure 5B:
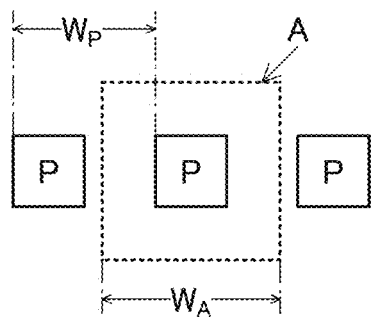

FIG. 5B shows a schematic view of three adjacent imaging elements P seen from the imaging plane side. The imaging elements P are positioned periodically at a pitch $W_P$. When the imaging region of the imaging element P on a predetermined imaging plane is a region A, the width of the region A is $W_A$.

FIG. 5A schematically illustrates a region $A_{00}$, a region $A_{01}$, a region $A_{10}$, and a region $A_{11}$, which are imaging regions of the imaging element $P_{00}$, an imaging element $P_{01}$, an imaging element $P_{10}$, and an imaging element $P_{11}$, respectively.

[Image Processing Method Example]

Figure 5C:
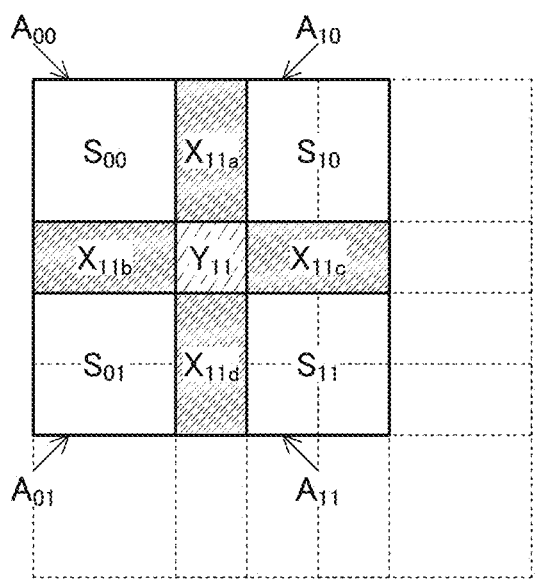
FIG. 5C is a diagram illustrating an image processing method.

FIG. 5C is a diagram illustrating the region $A_{00}$, the region $A_{01}$, the region $A_{10}$, and the region $A_{11}$ on the imaging plane. Here, a portion where the four regions overlap with each other is a region $Y_{11}$. Furthermore, portions other than the region $Y_{11}$, where two adjacent regions overlap with each other, are a region $X_{11a}$, a region $X_{11b}$, a region $X_{11c}$, and a region $X_{11d}$. Portions in the region $A_{00}$, the region $A_{01}$, the region $A_{10}$, and the region $A_{11}$ that do overlap with any region are a region $S_{00}$, a region $S_{01}$, a region $S_{10}$, and a region $S_{11}$. According to these relations, the pixel values of the regions satisfy Formulae (8) below.

[Formulae 8]

$$V_{A00} = V_{S00} + V_{X11a} + V_{X11b} + V_{Y11}$$

$$V_{A10} = V_{S10} + V_{X11a} + V_{X11c} + V_{Y11}$$

$$V_{A01} = V_{S01} + V_{X11b} + V_{X11d} + V_{Y11}$$

$$V_{A11} = V_{S11} + V_{X11c} + V_{X11d} + V_{Y11} \qquad (8)$$

A pixel value $V_{A00}$ to a pixel value $V_{A11}$ are values included in original image data. The pixel value $V_{S00}$ of the region $S_{00}$, a pixel value $V_{S01}$ of the region $S_{01}$, and a pixel value $V_{S10}$ of the region $S_{10}$ are known and supplied as initial values.

The region $X_{11a}$ is a region sandwiched between the region $S_{00}$ and the region $S_{10}$ and the region $X_{11a}$ is a region smaller than the maximum resolution of the imaging module IS (that is, the arrangement pitch of imaging elements), so that a pixel value $V_{X11a}$ of the region $X_{11a}$ can be regarded as an intermediate value between the pixel value $V_{S00}$ and the pixel value $V_{S10}$. In particular, when the pixel value $V_{S00}$ and the pixel value $V_{S10}$ are the same value, the pixel value $V_{X11a}$ is also the same value. Similarly, a pixel value $V_{X11b}$ of the region $X_{11b}$ can also be regarded as a known value.

That is, Formulae (8) have four unknown values: a pixel value $V_{S11}$, a pixel value $VX_{11c}$, a pixel value $V_{X11d}$, and a pixel value $V_{Y11}$. Thus, simultaneous equations of the four formulae in Formulae (8) are solved, whereby these four values can be determined (see Formulae (9)).

[Formulae 9]

$$V_{S11}=V_{A00}-V_{A10}-V_{A01}+V_{A11}-V_{S00}+V_{S01}+V_{S10}$$

$$V_{X11c}=V_{A10}-V_{A00}+V_{S00}-V_{S10}+V_{X11b}$$

$$V_{X11d}=V_{A01}-V_{A00}+V_{S00}-V_{S01}+V_{X11a}$$

$$V_{Y11}=V_{A00}-V_{S00}-V_{X11a}-V_{X11b} \quad (9)$$

Here, four pixels of 2×2 can be classified into four patterns illustrated in FIG. 6A to FIG. 6D.

Figure 6A:
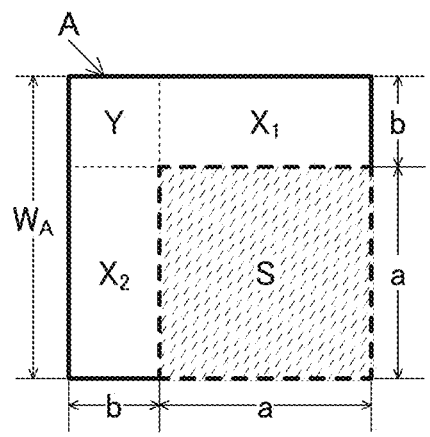
FIG. 6A to FIG. 6D are diagrams illustrating an image processing method.

A region A illustrated in FIG. 6A corresponds to the region $A_{11}$ in FIG. 5C; in the region A, a region S is positioned at a lower right portion, a region Y is positioned at an upper left portion, the region $X_1$ is positioned above the region S, and the region $X_2$ is positioned on the left side of the region S. Here, as in Example 1, the proportion of the width of the region S to the width $W_A$ of the region A is a, and the widths of the region $X_1$ and the region $X_2$ are each b (a and b are values satisfying a+b=1, a>0, b>0, and a>b).

Note that in the case where a is smaller than or equal to b, that is, the widths of the region $X_1$ and the region $X_2$ are larger than the width of the region S, Modification example 1 above can be referred to. In other words, it corresponds to the case where the imaging range of one imaging element overlaps with the imaging range of an imaging element rth from the one imaging element (r is an integer greater than or equal to 2), and in this case, a pixel value is determined focusing on pixels located at four corners of r×r adjacent pixels.

Figure 6B:
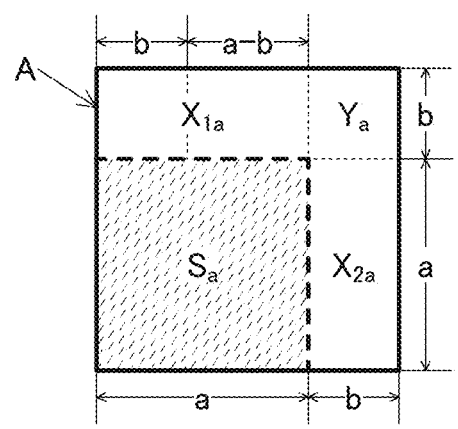
Figure 6C:
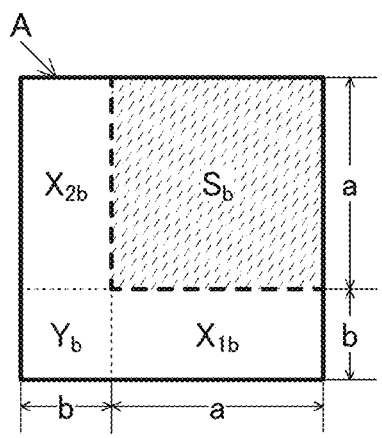
Figure 6D:
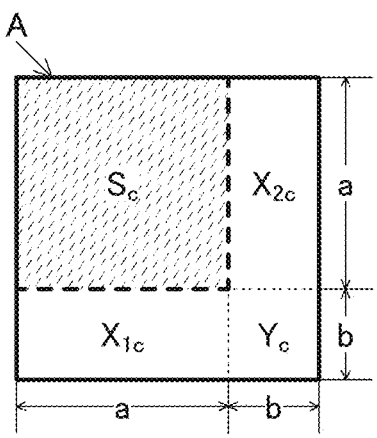

The region A illustrated in FIG. 6B corresponds to the region $A_{01}$ in FIG. 5C, and includes a region $S_a$ at a lower left portion in the region A. The region A illustrated in FIG. 6C corresponds to the region $A_{10}$ in FIG. 5C, and includes a region $S_b$ at an upper right portion in the region A. The region A illustrated in FIG. 6D corresponds to the region $A_{00}$ in FIG. 5C, and includes a region $S_c$ at an upper left portion in the region A.

When the gray level values of the regions of one of the four patterns of the region A are determined, the pixel values of the region S, the region $X_1$, the region $X_2$, and the region Y of the other patterns can be inductively determined.

For example, a pixel value $V_{Sa}$, a pixel value $V_{Sb}$, and a pixel value $V_{Sc}$ of the region $S_a$, the region $S_b$, and the region $S_c$ are as shown in Formulae (10) using a pixel value $V_S$, the pixel value $V_{X1}$, the pixel value $V_{X2}$, and a pixel value $V_Y$ of the region S, the region $X_1$, the region $X_2$, and the region Y in FIG. 6A and a and b.

[Formulae 10]

$$V_{Sa}=V_{X2}+V_S\times(a-b)/a$$

$$V_{Sb}=V_{X1}+V_S\times(a-b)/a$$

$$V_{Sc}=V_Y+(V_{X1}+V_{X2}+V_S\times(a-b)/a)\times((a-b)/a) \quad (10)$$

The region S, the region $X_1$, the region $X_2$, and the region Y in FIG. 6A can be regarded to have uniform luminance distribution. Therefore, for example, the pixel value of the region $X_{1a}$ illustrated in FIG. 6B can be regarded as being equal to a value obtained by adding a value obtained by multiplying the pixel value of the region $X_1$ by (a−b)/a to the pixel value of the region Y. The pixel value of a region $Y_a$ can be regarded as being equal to a value obtained by multiplying the pixel value of the region $X_1$ by b/a. The pixel value of a region $X_{2a}$ can be regarded as being equal to a value obtained by multiplying the pixel value of the region S by b/a. Hereinafter, the pixel values of a region $X_{1b}$, a region $X_{2b}$, and a region $Y_b$ in FIG. 6C and a region $X_{1c}$, a region $X_{2c}$, and a region $Y_c$ in FIG. 6D can be determined in a similar manner.

Figure 7A:
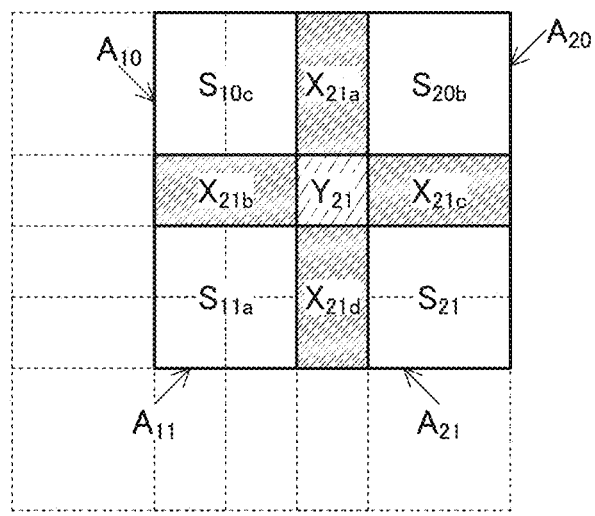
FIG. 7A to FIG. 7C are diagrams illustrating an image processing method.

In view of the above, four pixels shifted by one pixel from FIG. 5C are considered. FIG. 7A illustrates four pixels shifted in the X direction by one pixel. In FIG. 7A, the region $A_{10}$, a region $A_{20}$, the region $A_{11}$, and a region $A_{21}$ are indicated by solid lines. Here, since the region $A_{20}$ is a region of a pixel that is located at the upper end of a display region like the region $A_{10}$, the pixel values of a region $S_{20b}$ and a region $X_{21a}$ in FIG. 7A can be regarded as known values.

In FIG. 7A, the region A10 is divided into a region $S_{10c}$, the region $X_{21a}$, a region $X_{21b}$, and a region $Y_{21}$. The pixel values of the region $S_{10c}$ and the region $X_{21b}$ can be determined using the pixel values of the region $S_{10}$, the region $X_{11a}$, the region $X_{11c}$, and the region $Y_{11}$ by the above-described method. Note that although the pixel value of the region $X_{21a}$ can also be determined in a similar manner, the above-described known value is used here, whereby an error can be reduced.

Although the pixel values of the region $X_{21a}$ and the region $X_{21b}$ can be determined using the pixel values of regions in the region $A_{11}$ or the region $A_{20}$, the pixel values of the region $X_{21a}$ and the region $X_{21b}$ are determined using the pixel value of a region of a pixel close to the region $A_{00}$ of an endmost pixel in the display region (here, the region $A_{10}$), whereby an error can be reduced.

In such a manner, the pixel values of the region $S_{10c}$, the region $S_{20b}$, a region $S_{11a}$, the region $X_{21a}$, and the region $X_{21b}$ are determined in FIG. 7A. Then, using these pixel values, the pixel values of a region $S_{21}$, a region $X_{21c}$, a region $X_{21d}$, and the region $Y_{21}$ in the region $A_{21}$ can be determined by the above-described method.

Figure 7B:
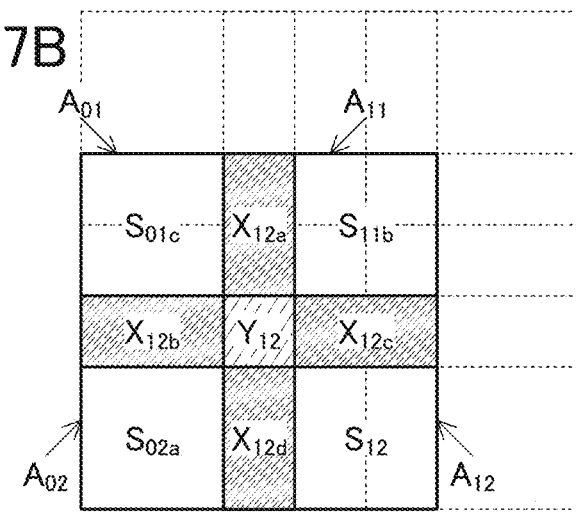

FIG. 7B illustrates four pixels shifted in the Y direction by one pixel from FIG. 5C. In FIG. 7B, the region $A_{01}$, the region $A_{11}$, a region $A_{02}$, and a region $A_{12}$ are indicated by solid lines. Since the region $A_{02}$ is a region of a pixel located at the left end of the display region like the region $A_{01}$, the pixel values of a region $S_{02a}$ and a region $X_{12b}$ in FIG. 7B can be regarded as known values.

Then, the pixel values of a region $S_{12}$, a region $X_{12c}$, a region $X_{12d}$, and a region $y_{12}$ in the region $A_{12}$ can be determined by the above-described method.

Figure 7C:
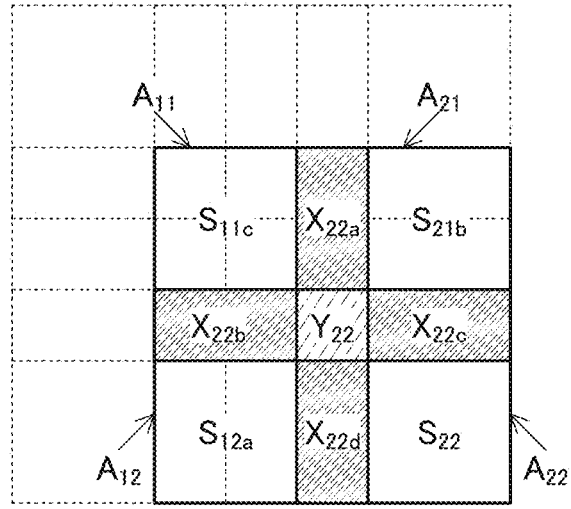

Lastly, FIG. 7C illustrates four pixels shifted in the X direction by one pixel and the Y direction by one pixel from FIG. 5C. In FIG. 7C, the region $A_{11}$, the region $A_{21}$, the region $A_{12}$, and a region $A_{22}$ are indicated by solid lines.

As the pixel values of a region $S_{11c}$, a region $S_{21b}$, and a region $S_{12a}$, values determined using the pixel values of the regions of the region $A_{11}$, the region $A_{21}$, and the region $A_{12}$, which are determined above, can be used. The pixel values of a region $X_{22a}$ and a region $X_{22b}$ can be determined using the pixel values of the regions of the region $A_{11}$. Using these pixel values, the pixel values of a region $S_{22}$, a region $X_{22c}$, a region $X_{22d}$, and a region $Y_{22}$ in the region $A_{22}$ can be determined.

In such a manner, a pixel value is supplied to an outermost pixel of a display region as an initial value, whereby the values of regions $S_{ij}$ of all pixels can be inductively determined.

Note that also in the case of two-dimensional image data, as in Modification example 2 in Example 1 above, a pixel value can be determined particularly easily when the width of the imaging range of an imaging element is an integer multiple of an arrangement pitch of imaging elements. Specifically, when the width of the imaging range of one imaging element is an integral multiple of the arrangement pitch of imaging elements, it is not necessary to obtain the pixel value of a region (e.g., the region $X_{11a}$ or the region $Y_{11}$) where the imaging ranges of two imaging elements overlap with each other, so that the calculation amount can be significantly reduced compared to the above.

[Corrected Image Data]

Using a pixel value calculated as described above, less blurred and sharpened new image data can be generated.

FIG. 8A shows a schematic view of original image data $D_0$ before image correction. The image data $D_0$ includes pixel values $V_{Aij}$ corresponding to (m+1)×(n+1) pixels (i is an integer greater than or equal to 0 and less than or equal to m and j is an integer greater than or equal to 0 and less than or equal to n). The pixels each include the pixel value $V_{Aij}$ including information overlapping between adjacent pixels, so that the image data $D_0$ is blurred image data.

FIG. 8B is a schematic view of the image data $D_1$ after image correction. The image data $D_1$ includes information of pixel values $V_{Sij}$ corresponding to m×n pixels (i is an integer greater than or equal to 1 and less than or equal to m and j is an integer greater than or equal to 1 and less than or equal to n). Note that the image data $D_1$ may include the pixel value $V_{S00}$, a pixel value $V_{Si0}$, and a pixel value $V_{S0j}$ used as known information so as to be image data having the same number of pixels as the original image data $D_0$.

[Structure Example of Imaging Device]

An imaging device capable of performing the image correction of one embodiment of the present invention will be described below.

Figure 9:
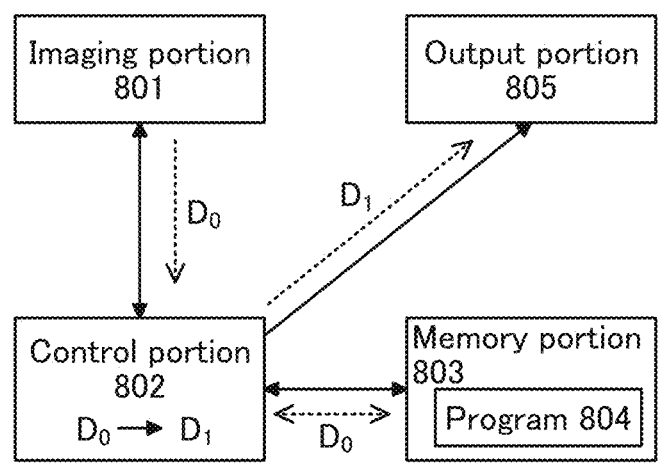
FIG. 9 is a structure example of an imaging device.

FIG. 9 shows a block diagram of an imaging device 800. The imaging device 800 includes at least an imaging portion 801, a control portion 802, and a memory portion 803. A program 804 is stored in the memory portion 803. The imaging device 800 may include an output portion 805.

The imaging portion 801 has a function of obtaining image data (also referred to as performing imaging). The imaging module IS corresponds to the imaging portion 801, for example. As the imaging portion 801, a semiconductor device in which imaging elements each including a photoelectric conversion element are arranged in a matrix can be used.

Specific examples of the imaging portion 801 include an image sensor IC, an optical touch pad, and a display panel including an image sensor. Alternatively, a display panel including an optical touch sensor may be used. As the imaging element, an imaging element capable of detecting not only visible light but also at least one light among light with various wavelengths (energy) such as infrared rays, near infrared rays, ultraviolet rays, near ultraviolet rays, X-rays, and gamma rays can be used. The imaging portion 801 may include two or more kinds of imaging elements capable of detecting light with different wavelengths.

The memory portion 803 has a function of storing at least the program 804. The memory portion 803 can output stored data to the control portion 802 or store the data in accordance with a request from the control portion 802. The program 804 stored in the memory portion 803 is read out and then executed by the control portion 802.

As the memory portion 803, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example. Furthermore, a memory media drive such as a hard disk drive (HDD) or a solid state drive (SSD) may be used, for example.

A memory device that can be connected and disconnected through an external interface with a connector, such as an HDD or an SSD, or a media drive for a recording medium such as a flash memory, a Blu-ray disc (registered trademark), or a DVD can also be used as the memory portion 803. Note that the memory portion 803 is not incorporated in the imaging device 800, and a memory device located outside the imaging device 800 may be used as the memory portion 803. In that case, the memory device may be connected through the external interface, or data transmission and reception may be wirelessly performed using a communication module.

Alternatively, the program 804 may be stored in an external server. In this case, when a user accesses the server, part or all of the program 804 may be stored in the memory portion 803 temporarily, permanently, or semipermanently (the case where an available period or an available number of times is set), and may be executed by the control portion 802.

The control portion 802 has a function of collectively controlling the components such as the imaging portion 801, the memory portion 803, and the output portion 805.

The control portion 802 interprets and executes instructions from various programs with the use of a processor to process various kinds of data and control programs. A program that can be executed by the processor is read out from the memory portion 803, stored in a memory region of the processor temporarily, and executed.

A central processing unit (CPU) and other microprocessors such as a DSP (Digital Signal Processor) and a GPU (Graphics Processing Unit) can be used alone or in combination as the control portion 802. A structure may be employed in which such a microprocessor is obtained with a PLD (Programmable Logic Device) such as an FPGA (Field Programmable Gate Array) or an FPAA (Field Programmable Analog Array).

The output portion 805 has a function of outputting data to the outside. For example, with the output portion 805, the imaging device 800 and an external device can be connected to each other through a cable. Alternatively, as the output portion 805, a LAN (Local Area Network) connection terminal, an AC adaptor connection terminal, or the like may be included. Without limitation to wire communication, a transceiver for optical communication using infrared rays, visible light, ultraviolet rays, or the like may be provided as the output portion 805.

Next, an operation example of the imaging device 800 is described.

First, the control portion 802 requires the imaging portion 801 to perform imaging operation, and accordingly the imaging portion 801 performs imaging and outputs the image data Do to the control portion 802 (that is, the control portion 802 reads out the image data Do from the imaging portion 801). The control portion 802 may store the image data Do in the memory portion 803 once or the image data Do may be held in the control portion 802.

Since the imaging portion 801 includes a plurality of imaging elements whose imaging ranges partly overlap with each other as described above, the image data Do is image data including a blur.

The control portion 802 reads out the program 804 from the memory portion 803 and executes it, whereby the image data $D_1$ is newly generated from the image data Do. During the execution of the program 804, the control portion 802 reads out the image data Do from the memory portion 803 in some cases.

The control portion 802 may output the generated image data $D_1$ to the output portion 805. Alternatively, the control portion 802 may store the generated image data $D_1$ in the memory portion 803.

After the control portion 802 reads out the program 804, the control portion 802 may receive the image data Do from the imaging portion 801. In this case, the control portion 802 may generate the image data $D_1$ without storing the image data Do in the memory portion 803 temporarily.

The program 804 includes a program for executing the above-described image processing in the control portion 802.

For example, the program 804 includes a step of reading out the image data $D_0$ in which a plurality of pixels are arranged; a step of dividing each of two adjacent pixels into a first region showing the same pixel value and a second region other than the first region; a step of supplying an initial value to the second region of an endmost pixel of the image data Do; and a step of inductively and sequentially determining the pixel values of the first regions and the second regions of the plurality of arranged pixels on the basis of the initial value.

In addition, for example, the program 804 includes a step of reading the image data Do in which a plurality of pixels are arranged in a matrix; dividing each of 2×2 pixels into a first region showing the same gray level value (pixel value) as that of an adjacent pixel and a second region other than the first region; a step of supplying initial values to the second regions of three outermost pixels of the 2×2 endmost pixels of the image data Do; a step of determining the pixel values of the first region and the second region of one residual pixel on the basis of the initial values; and a step of inductively and sequentially determining the pixel values of the first regions and the second regions of the plurality of arranged pixels on the basis of the determined pixel values of the first region and the second region.

Such an imaging device 800 can sharpen and output even blurred image data. Thus, a structure in which a focus adjustment mechanism or a special optical system is not used for the imaging portion 801 can be employed. Accordingly, the device structure is simplified, so that an imaging device can be manufactured at a low cost.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

In this embodiment, display devices of embodiments of the present invention are described with reference to FIG. 10 to FIG. 18.

A display device described below as an example is a device having a function of displaying an image and a function of taking an image. The display device described below as an example can be used for the imaging module IS in Embodiment 1 or an imaging portion of an imaging device.

[Overview]

The display device of this embodiment includes light-receiving elements and light-emitting elements. Specifically, the light-emitting elements are arranged in a matrix in the display portion, and an image can be displayed on the display portion. Moreover, the light-receiving elements are arranged in a matrix in the display portion, so that the display portion also has a function of a light-receiving portion. The light-receiving portion can be used as an image sensor or a touch sensor. That is, by sensing light with the light-receiving portion, an image can be taken and the approach or contact of an object (e.g., a finger or a stylus) can be detected.

In the display device of this embodiment, when an object reflects light emitted from the light-emitting element included in the display portion, the light-receiving element can sense the reflected light; thus, imaging and touch (including near touch) detection are possible even in a dark place.

The display device of this embodiment has a function of displaying an image with the use of a light-emitting element. That is, the light-emitting element functions as a display element.

As the light-emitting element, an EL element such as an OLED (Organic Light Emitting Diode) or a QLED (Quantum-dot Light Emitting Diode) is preferably used. As the light-emitting substance contained in the EL element, a substance emitting fluorescence (a fluorescent material), a substance emitting phosphorescence (a phosphorescent material), an inorganic compound (e.g., a quantum dot material), a substance exhibiting thermally activated delayed fluorescence (a thermally activated delayed fluorescent (TADF) material), or the like can be given. Alternatively, a light-emitting diode (LED) such as a micro-LED can be used as the light-emitting element.

The display device of this embodiment has a function of sensing light with the use of a light-receiving element.

When the light-receiving element is used as an image sensor, an image can be taken with the use of the light-receiving element.

For example, data on a fingerprint, a palm print, an iris, or the like can be acquired with the use of the image sensor. That is, a biological authentication sensor can be incorporated into the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

In addition, data on facial expression, eye movement, change of the pupil diameter, or the like of the user can be acquired with the use of the image sensor. By analysis of the data, data on the user's physical and mental state can be acquired. Changing the output contents of one or both of display and sound on the basis of the information allows the user to safely use a device for VR (Virtual Reality), AR (Augmented Reality), or MR (Mixed Reality), for example.

When the light-receiving element is used as the touch sensor, the display device of this embodiment can detect the approach or contact of an object with the use of the light-receiving element.

As the light-receiving element, a PN photodiode or a PIN photodiode can be used, for example. The light-receiving element functions as a photoelectric conversion element that senses light incident on the light-receiving element and generates charge. The amount of generated electric charge depends on the amount of incident light.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, organic EL elements are used as the light-emitting elements, and organic photodiodes are used as the light-receiving elements. A large number of layers of the organic photodiode can be shared with the organic EL element. Accordingly, the light-receiving element can be incorporated into the display device without a significant increase in the number of manufacturing steps. For example, an active layer of the light-receiving element and a light-emitting layer of the light-emitting element are separately formed, and the other layers can be shared by the light-emitting element and the light-receiving element.

FIG. 10A to FIG. 10D show cross-sectional views of display devices of embodiments of the present invention.

Figure 10A:
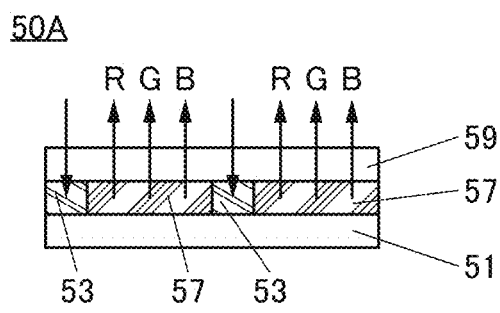
FIG. 10A to FIG. 10D are cross-sectional views showing examples of a display device.

A display device 50A illustrated in FIG. 10A includes a layer 53 including a light-receiving element and a layer 57 including a light-emitting element between a substrate 51 and a substrate 59.

Figure 10B:
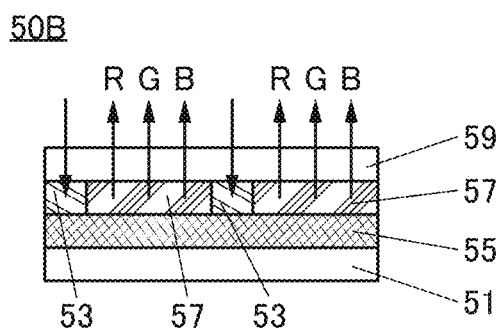

A display device 50B illustrated in FIG. 10B includes the layer 53 including a light-receiving element, a layer 55 including transistors, and the layer 57 including a light-emitting element between the substrate 51 and the substrate 59.

In the display device 50A and the display device 50B, red (R) light, green (G) light, and blue (B) light are emitted from the layer 57 including a light-emitting element.

The display device of one embodiment of the present invention includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes a light-receiving element. The light-receiving element may be provided in all the pixels or may be provided in some of the pixels. In addition, one pixel may include a plurality of light-receiving elements.

The layer 55 including transistors preferably includes a first transistor and a second transistor. The first transistor is electrically connected to the light-receiving element. The second transistor is electrically connected to the light-emitting element.

Figure 10C:
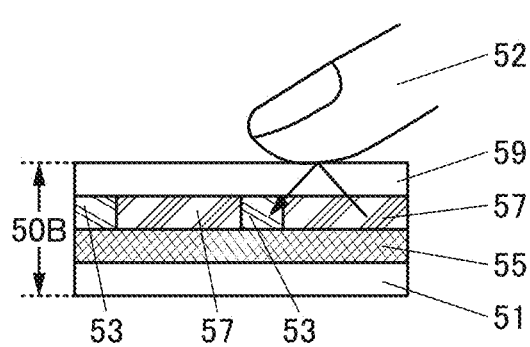

The display device of one embodiment of the present invention may have a function of detecting an object such as a finger that is touching the display device. For example, after light emitted from the light-emitting element in the layer 57 including the light-emitting element is reflected by a finger 52 that touches the display device 50B as illustrated in FIG. 10C, the light-receiving element in the layer 53 including the light-receiving element senses the reflected light. Thus, the touch of the finger 52 on the display device 50B can be detected.

Figure 10D:
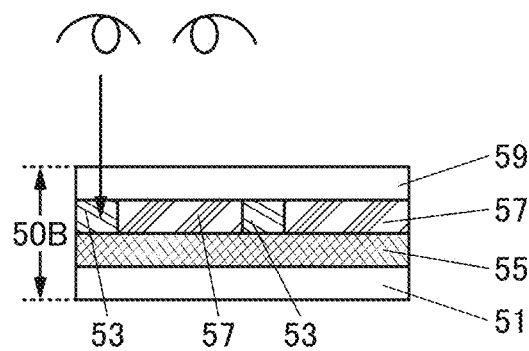

The display device of one embodiment of the present invention may have a function of detecting an object that is approaching (but is not touching) the display device 50B as illustrated in FIG. 10D or taking an image of such an object.

FIG. 10E to FIG. 10H show examples of the pixel.

Figure 10E:
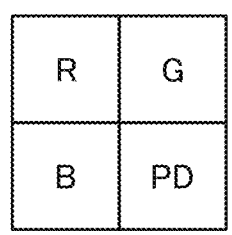
FIG. 10E to FIG. 10H are top views showing examples of a pixel.
Figure 10F:
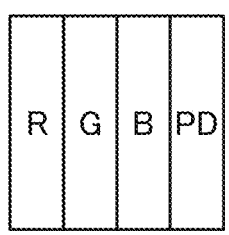

The pixels illustrated in FIG. 10E and FIG. 10F each include three subpixels (three light-emitting elements) of R, G, and B and a light-receiving element PD. FIG. 10E shows an example in which the three subpixels and the light-receiving element PD are arranged in a 2×2 matrix, and FIG. 10F shows an example in which the three subpixels and the light-receiving element PD are arranged horizontally in one line.

Figure 10G:
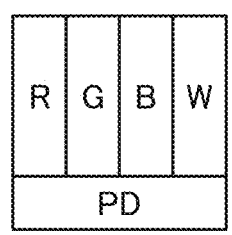

The pixel illustrated in FIG. 10G includes four subpixels (four light-emitting elements) of R, G, B, and W and the light-receiving element PD.

Figure 10H:
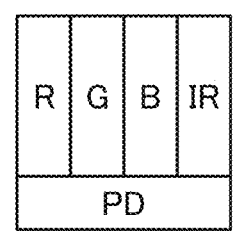

The pixel illustrated in FIG. 10H includes three subpixels of R, G, and B, a light-emitting element IR that emits infrared light, and the light-receiving element PD. Here, the light-receiving element PD preferably has a function of sensing infrared light. The light-emitting element PD may have a function of sensing both visible light and infrared light. The wavelength of light that the light-receiving element PD senses can be determined depending on the application of the sensor.

A more detailed structure of the display device of one embodiment of the present invention will be described below with reference to FIG. 11 to FIG. 13.

[Display Device 10A]

Figure 11A:
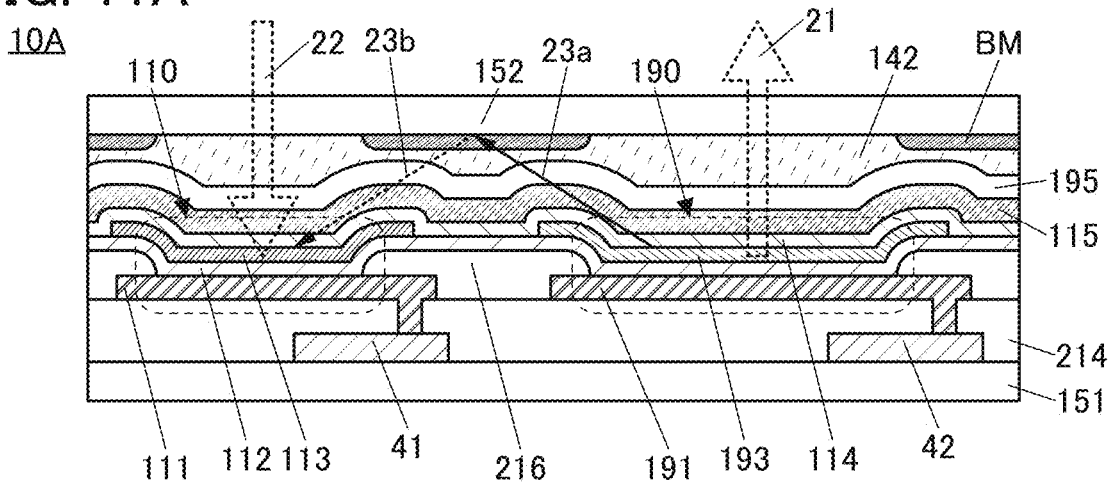
FIG. 11A to FIG. 11C are cross-sectional views showing examples of a display device.

FIG. 11A shows a cross-sectional view of a display device 10A.

The display device 10A includes a light-receiving element 110 and a light-emitting element 190.

The light-receiving element 110 includes a pixel electrode 111, a common layer 112, an active layer 113, a common layer 114, and a common electrode 115.

The light-emitting element 190 includes a pixel electrode 191, the common layer 112, a light-emitting layer 193, the common layer 114, and the common electrode 115.

The pixel electrode 111, the pixel electrode 191, the common layer 112, the active layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is shared by the light-receiving element 110 and the light-emitting element 190.

The active layer 113 overlaps with the pixel electrode 111 with the common layer 112 therebetween. The light-emitting layer 193 overlaps with the pixel electrode 191 with the common layer 112 therebetween. The active layer 113 contains a first organic compound, and the light-emitting layer 193 contains a second organic compound that is different from the first organic compound.

The common layer 114 is positioned over the common layer 112, the active layer 113, and the light-emitting layer 193. The common layer 114 is a layer shared by the light-receiving element 110 and the light-emitting element 190.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layer 193, and the common layer 114 therebetween. The common electrode 115 is a layer shared by the light-receiving element 110 and the light-emitting element 190.

In the display device of this embodiment, an organic compound is used for the active layer 113 of the light-receiving element 110. In the light-receiving element 110, the layers other than the active layer 113 can be common to the layers in the light-emitting element 190 (the EL element). Therefore, the light-receiving element 110 can be formed concurrently with the formation of the light-emitting element 190 only by adding a step of depositing the active layer 113 in the manufacturing process of the light-emitting element 190. The light-emitting element 190 and the light-receiving element 110 can be formed over one substrate. Accordingly, the light-receiving element 110 can be incorporated into the display device without a significant increase in the number of manufacturing steps.

The display device 10A shows an example in which the light-receiving element 110 and the light-emitting element 190 have a common structure except that the active layer 113 of the light-receiving element 110 and the light-emitting layer 193 of the light-emitting element 190 are separately formed. Note that the structures of the light-receiving element 110 and the light-emitting element 190 are not limited thereto. The light-receiving element 110 and the light-emitting element 190 may include a separately formed layer other than the active layer 113 and the light-emitting layer 193 (see display devices 10K, 10L, and 10M described later). The light-receiving element 110 and the light-emitting element 190 preferably include at least one layer used in common (common layer). Thus, the light-receiving element 110 can be incorporated into the display device without a significant increase in the number of manufacturing steps.

The display device 10A includes the light-receiving element 110, the light-emitting element 190, a transistor 41, a transistor 42, and the like between a pair of substrates (a substrate 151 and a substrate 152).

In the light-receiving element 110, the common layer 112, the active layer 113, and the common layer 114 that are positioned between the pixel electrode 111 and the common electrode 115 can each be referred to as an organic layer (a layer containing an organic compound). The pixel electrode 111 preferably has a function of reflecting visible light. An end portion of the pixel electrode 111 is covered with a partition wall 216. The common electrode 115 has a function of transmitting visible light.

The light-receiving element 110 has a function of sensing light. Specifically, the light-receiving element 110 is a photoelectric conversion element that receives light 22 incident from the outside of the display device 10A and converts it into an electric signal. The light 22 can also be expressed as light that is emitted by the light-emitting element 190 and then reflected by an object. The light 22 may enter the light-receiving element 110 through a lens described later.

A light-blocking layer BM is provided on a surface of the substrate 152 on the substrate 151 side. The light-blocking layer BM has openings at a position overlapping with the light-receiving element 110 and at a position overlapping with the light-emitting element 190.

Providing the light-blocking layer BM can control the range where the light-receiving element 110 senses light.

For the light-blocking layer BM, a material that blocks light emitted from the light-emitting element can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

Here, the light-receiving element 110 senses light that is emitted by the light-emitting element 190 and then reflected by an object. However, in some cases, light emitted from the light-emitting element 190 is reflected inside the display device 10A and enters the light-receiving element 110 without via an object. The light-blocking layer BM can reduce the influence of such stray light. For example, in the case where the light-blocking layer BM is not provided, light 23a emitted from the light-emitting element 190 is reflected by the substrate 152 and reflected light 23b is incident on the light-receiving element 110 in some cases. Providing the light-blocking layer BM can inhibit entry of the reflected light 23b into the light-receiving element 110. Consequently, noise can be reduced, and the sensitivity of a sensor using the light-receiving element 110 can be increased.

In the light-emitting element 190, the common layer 112, the light-emitting layer 193, and the common layer 114 that are positioned between the pixel electrode 191 and the common electrode 115 can each be referred to as an EL layer. The pixel electrode 191 preferably has a function of reflecting visible light. An end portion of the pixel electrode 191 is covered with the partition wall 216. The pixel electrode 111 and the pixel electrode 191 are electrically insulated from each other by the partition wall 216. The common electrode 115 has a function of transmitting visible light.

The light-emitting element 190 has a function of emitting visible light. Specifically, the light-emitting element 190 is an electroluminescent element that emits light to the substrate 152 side by applying voltage between the pixel electrode 191 and the common electrode 115 (see light emission 21).

It is preferable that the light-emitting layer 193 be formed not to overlap with a light-receiving region of the light-receiving element 110. Accordingly, it is possible to inhibit the light-emitting layer 193 from absorbing the light 22, so that the amount of light with which the light-receiving element 110 is irradiated can be increased.

The pixel electrode 111 is electrically connected to a source or a drain of the transistor 41 through an opening provided in the insulating layer 214. An end portion of the pixel electrode 111 is covered with the partition wall 216.

The pixel electrode 191 is electrically connected to a source or a drain of the transistor 42 through an opening provided in the insulating layer 214. An end portion of the pixel electrode 191 is covered with the partition wall 216. The transistor 42 has a function of controlling the driving of the light-emitting element 190.

The transistor 41 and the transistor 42 are on and in contact with the same layer (the substrate 151 in FIG. 11A).

At least part of a circuit electrically connected to the light-receiving element 110 is preferably formed using the same material in the same steps as a circuit electrically connected to the light-emitting element 190. Accordingly, the thickness of the display device can be smaller and the manufacturing process can be simpler than those in the case where the two circuits are separately formed.

The light-receiving element 110 and the light-emitting element 190 are preferably covered with a protective layer 195. In FIG. 11A, the protective layer 195 is provided on and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are bonded to each other with an adhesive layer 142.

Figure 12A:
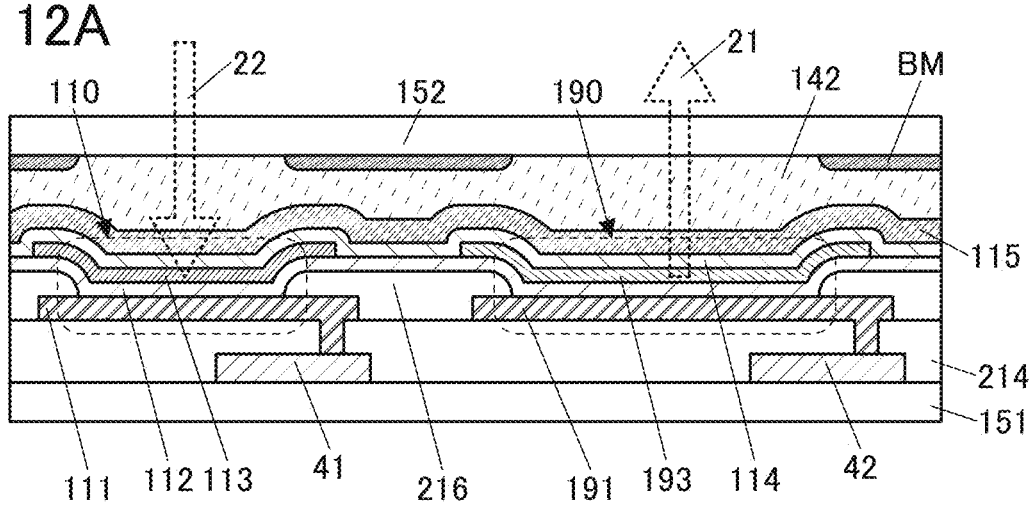
FIG. 12A to FIG. 12C are cross-sectional views showing examples of a display device.

Note that as illustrated in FIG. 12A, the protective layer is not necessarily provided over the light-receiving element 110 and the light-emitting element 190. In FIG. 12A, the common electrode 115 and the substrate 152 are bonded to each other with the adhesive layer 142.

[Display Device 10B]

Figure 11B:
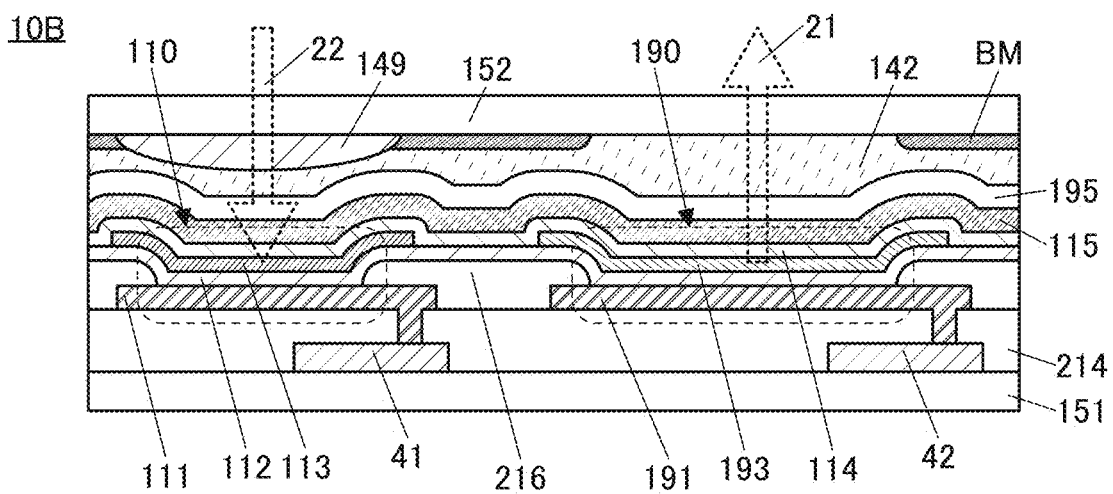

FIG. 11B shows a cross-sectional view of a display device 10B. Note that in the description of the display device below, components similar to those of the above-described display device are not described in some cases.

The display device 10B illustrated in FIG. 11B includes a lens 149 in addition to the components of the display device 10A.

The display device of this embodiment may include the lens 149. The lens 149 is provided at a position overlapping with the light-receiving element 110. In the display device 10B, the lens 149 is provided in contact with the substrate 152. The lens 149 included in the display device 10B has a convex surface on the substrate 151 side. Alternatively, the lens 149 may have a convex surface on the substrate 152 side.

In the case where the light-blocking layer BM and the lens 149 are formed on the same plane of the substrate 152, their formation order is not limited. FIG. 11B shows an example in which the lens 149 is formed first; alternatively, the light-blocking layer BM may be formed first. In FIG. 11B, an end portion of the lens 149 is covered with the light-blocking layer BM.

In the display device 10B, the light 22 is incident on the light-receiving element 110 through the lens 149. With the lens 149, the imaging range of the light-receiving element 110 can be narrowed as compared to the case where the lens 149 is not provided, thereby inhibiting overlap between the imaging ranges of the adjacent light-receiving elements 110. Thus, a clear image that is less blurred can be taken. Given that the imaging range of the light-receiving element 110 does not change, the lens 149 allows the size of a pinhole (corresponding to the size of an opening in BM that overlaps with the light-receiving element 110 in FIG. 11B) to be increased, compared to the case where the lens 149 is not provided. Hence, providing the lens 149 can increase the amount of light entering the light-receiving element 110.

Figure 12B:
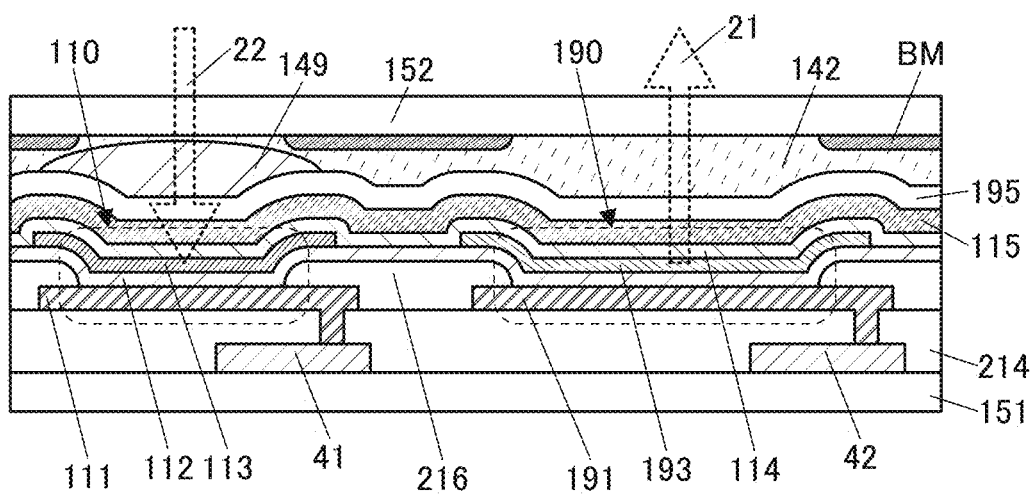
Figure 12C:
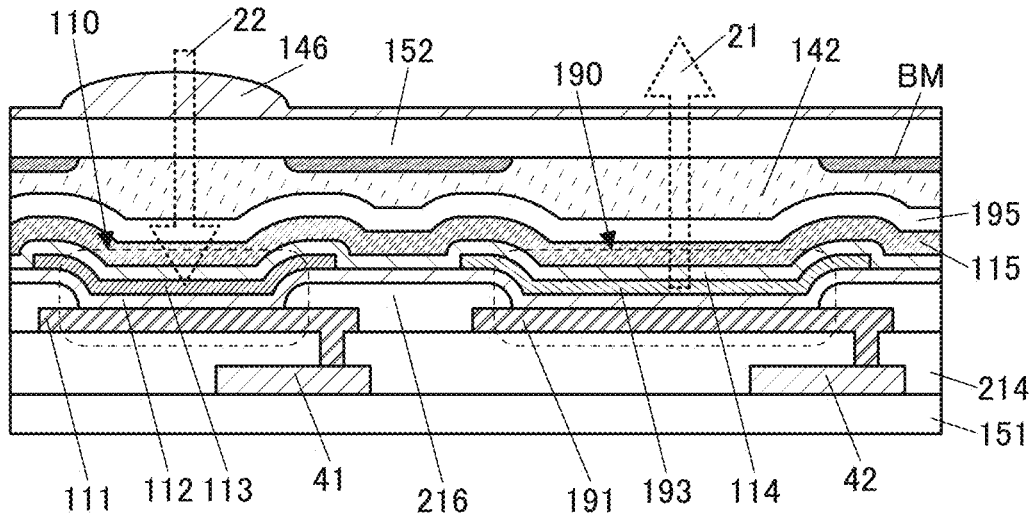

Like the display device 10B illustrated in FIG. 11B, each of display devices illustrated in FIG. 12B and FIG. 12C also has a structure in which the light 22 enters the light-receiving element 110 through the lens 149.

In FIG. 12B, the lens 149 is provided in contact with a top surface of the protective layer 195. The lens 149 included in the display device illustrated in FIG. 12B has a convex surface on the substrate 152 side.

In the display device illustrated in FIG. 12C, a lens array 146 is provided on the display surface side of the substrate 152. A lens included in the lens array 146 is provided at the position overlapping with the light-receiving element 110.

The light-blocking layer BM is preferably provided on the surface of the substrate 152 on the substrate 151 side.

As a method for forming the lens used in the display device of this embodiment, a lens such as a microlens may be formed directly over the substrate or the light-receiving element, or a lens array formed separately, such as a microlens array, may be bonded to the substrate.

[Display Device 10C]

Figure 11C:
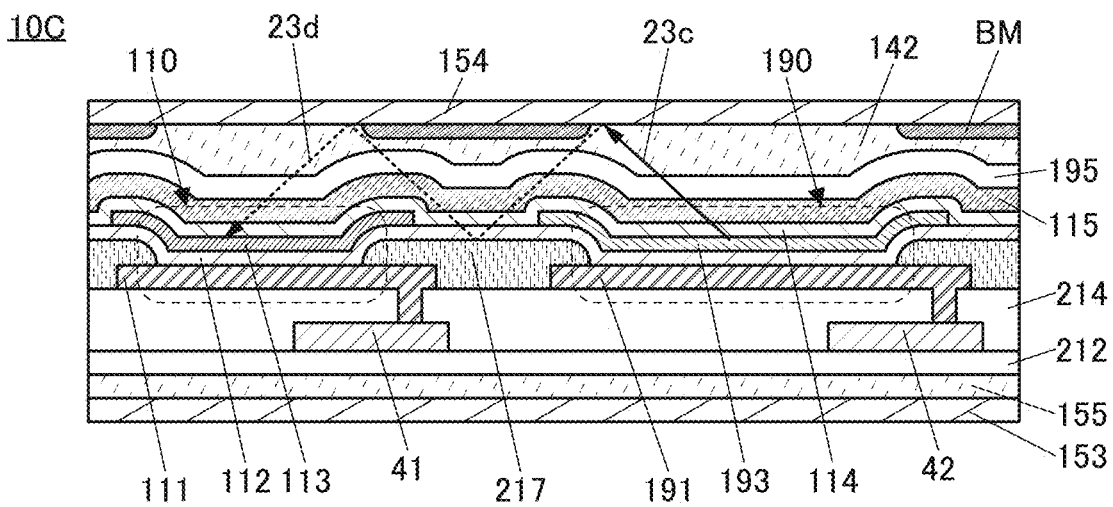

FIG. 11C shows a cross-sectional view of a display device 10C.

The display device 10C illustrated in FIG. 11C differs from the display device 10A in that the substrate 151, the substrate 152, and the partition wall 216 are not included and a substrate 153, a substrate 154, an adhesive layer 155, an insulating layer 212, and a partition wall 217 are included.

The substrate 153 and the insulating layer 212 are bonded to each other with the adhesive layer 155. The substrate 154 and the protective layer 195 are bonded to each other with the adhesive layer 142.

The display device 10C has a structure formed in such a manner that the insulating layer 212, the transistor 41, the transistor 42, the light-receiving element 110, the light-emitting element 190, and the like that are formed over a formation substrate are transferred onto the substrate 153. The substrate 153 and the substrate 154 are preferably flexible. Accordingly, the flexibility of the display device 10C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display device of this embodiment, a film having high optical isotropy may be used. Examples of a highly optically isotropic film include a triacetyl cellulose (TAC, also referred to as cellulose triacetate) film, a cycloolefin polymer (COP) film, a cycloolefin copolymer (COC) film, and an acrylic film.

The partition wall 217 preferably absorbs light emitted from the light-emitting element. As the partition wall 217, a black matrix can be formed using a resin material containing a pigment or dye, for example. Moreover, the partition wall 217 can be formed of a colored insulating layer by using a brown resist material.

In some cases, light 23c emitted from the light-emitting element 190 is reflected by the substrate 154 and the partition wall 217 and reflected light 23d is incident on the light-receiving element 110. In other cases, the light 23c passes through the partition wall 217 and is reflected by a transistor, a wiring, or the like, and thus reflected light is incident on the light-receiving element 110. When the partition wall 217 absorbs the light 23c, the reflected light 23d can be inhibited from being incident on the light-receiving element 110. Consequently, noise can be reduced, and the sensitivity of a sensor using the light-receiving element 110 can be increased.

The partition wall 217 preferably absorbs at least light having a wavelength that is sensed by the light-receiving element 110. For example, in the case where the light-receiving element 110 senses green light emitted from the light-emitting element 190, the partition wall 217 preferably absorbs at least green light. For example, when the partition wall 217 includes a red color filter, the green light 23c can be absorbed and thus the reflected light 23d can be inhibited from being incident on the light-receiving element 110.

[Display Devices 10K, 10L, and 10M]

Figure 13A:
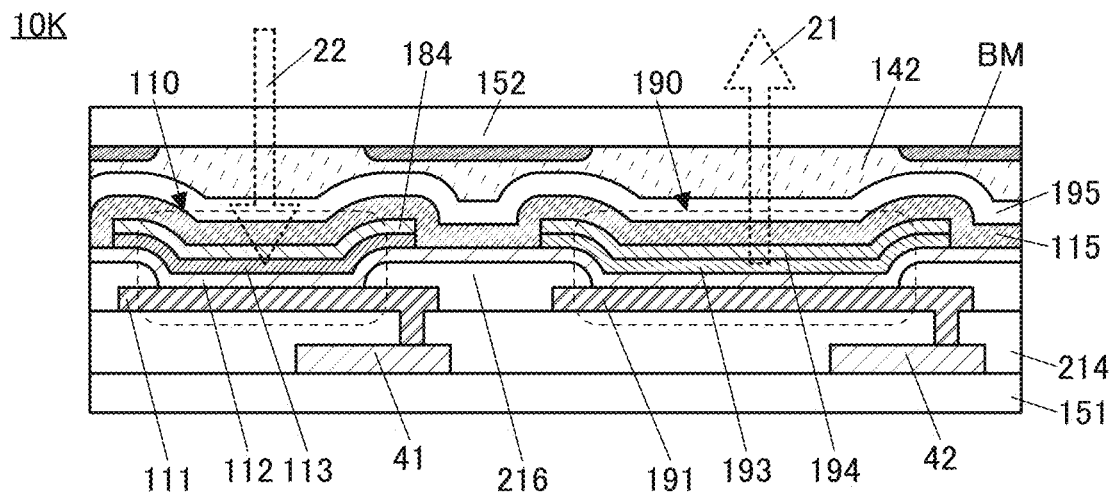
FIG. 13A to FIG. 13C are cross-sectional views showing examples of a display device.
Figure 13B:
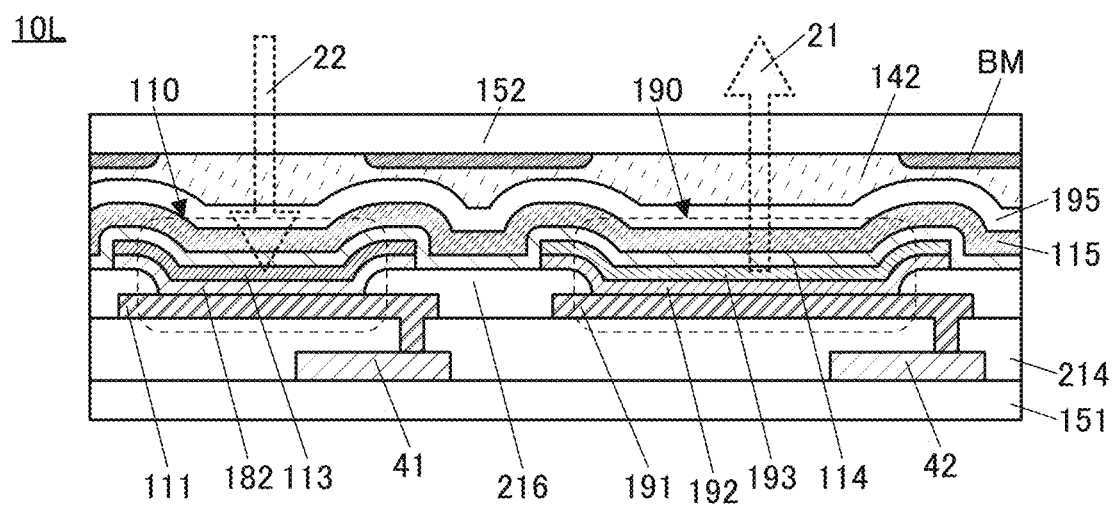
Figure 13C:
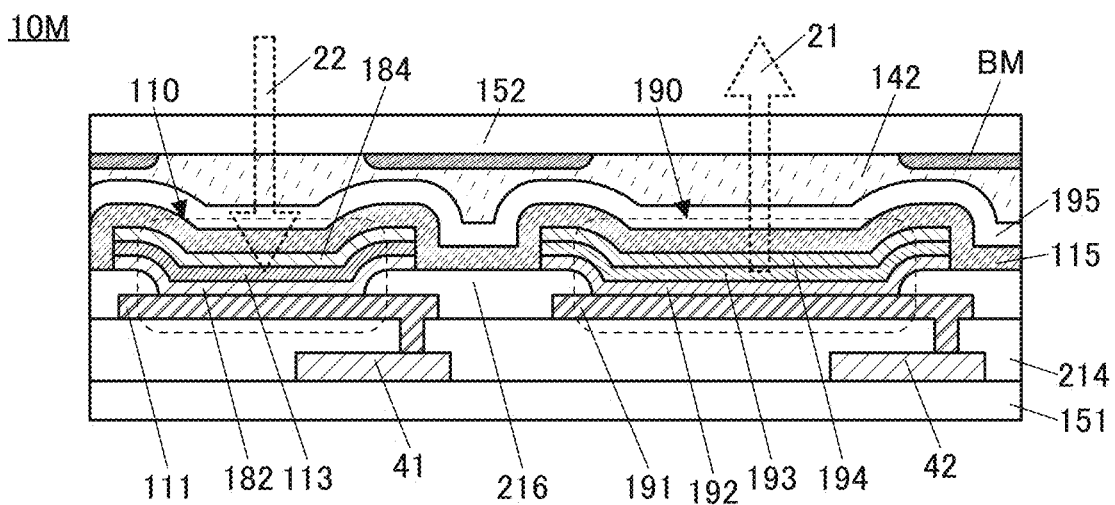

FIG. 13A shows a cross-sectional view of the display device 10K, FIG. 13B shows a cross-sectional view of the display device 10L, and FIG. 13C shows a cross-sectional view of the display device 10M.

The display device 10K differs from the display device 10A in that the common layer 114 is not included and a buffer layer 184 and a buffer layer 194 are included. The buffer layer 184 and the buffer layer 194 may each have a single-layer structure or a stacked-layer structure.

In the display device 10K, the light-receiving element 110 includes the pixel electrode 111, the common layer 112, the active layer 113, the buffer layer 184, and the common electrode 115. In the display device 10K, the light-emitting element 190 includes the pixel electrode 191, the common layer 112, the light-emitting layer 193, the buffer layer 194, and the common electrode 115.

The display device 10L differs from the display device 10A in that the common layer 112 is not included and a buffer layer 182 and a buffer layer 192 are included. The buffer layer 182 and the buffer layer 192 may each have a single-layer structure or a stacked-layer structure.

In the display device 10L, the light-receiving element 110 includes the pixel electrode 111, the buffer layer 182, the active layer 113, the common layer 114, and the common electrode 115. In the display device 10L, the light-emitting element 190 includes the pixel electrode 191, the buffer layer 192, the light-emitting layer 193, the common layer 114, and the common electrode 115.

The display device 10M differs from the display device 10A in that the common layer 112 and the common layer 114 are not included and the buffer layer 182, the buffer layer 184, the buffer layer 192, and the buffer layer 194 are included.

In the display device 10M, the light-receiving element 110 includes the pixel electrode 111, the buffer layer 182, the active layer 113, the buffer layer 184, and the common electrode 115. In the display device 10M, the light-emitting element 190 includes the pixel electrode 191, the buffer layer 192, the light-emitting layer 193, the buffer layer 194, and the common electrode 115.

Other layers as well as the active layer 113 and the light-emitting layer 193 can be formed separately when the light-receiving element 110 and the light-emitting element 190 are manufactured.

In the display device 10K, an example is shown in which the buffer layer 184 between the common electrode 115 and the active layer 113 and the buffer layer 194 between the common electrode 115 and the light-emitting layer 193 are formed separately. As the buffer layer 194, one or both of an electron-injection layer and an electron-transport layer can be formed, for example.

In the display device 10L, an example is shown in which the buffer layer 182 between the pixel electrode 111 and the active layer 113 and the buffer layer 192 between the pixel electrode 191 and the light-emitting layer 193 are formed separately. As the buffer layer 192, one or both of a hole-injection layer and a hole-transport layer can be formed, for example.

In the display device 10M, an example is shown in which in each of the light-receiving element 110 and the light-emitting element 190, a common layer is not provided between the pair of electrodes (the pixel electrode 111 or the pixel electrode 191 and the common electrode 115). The light-receiving element 110 and the light-emitting element 190 included in the display device 10M can be manufactured in the following manner: the pixel electrode 111 and the pixel electrode 191 are formed over the insulating layer 214 using the same material in the same step; the buffer layer 182, the active layer 113, and the buffer layer 184 are formed over the pixel electrode 111; the buffer layer 192, the light-emitting layer 193, and the buffer layer 194 are formed over the pixel electrode 191; and then, the common electrode 115 is formed to cover the pixel electrode 111, the buffer layer 182, the active layer 113, the buffer layer 184, the pixel electrode 191, the buffer layer 192, the light-emitting layer 193, and the buffer layer 194. Note that the manufacturing order of the stacked-layer structure of the buffer layer 182, the active layer 113, and the buffer layer 184 and the stacked-layer structure of the buffer layer 192, the light-emitting layer 193, and the buffer layer 194 is not particularly limited. For example, after the buffer layer 182, the active layer 113, and the buffer layer 184 are deposited, the buffer layer 192, the light-emitting layer 193, and the buffer layer 194 may be formed. In contrast, the buffer layer 192, the light-emitting layer 193, and the buffer layer 194 may be formed before the buffer layer 182, the active layer 113, and the buffer layer 184 are deposited. Alternatively, the buffer layer 182, the buffer layer 192, the active layer 113, and the light-emitting layer 193 may be deposited in that order, for example.

A more detailed structure of the display device of one embodiment of the present invention will be described below with reference to FIG. 14 to FIG. 18.

[Display Device 100A]

Figure 14:
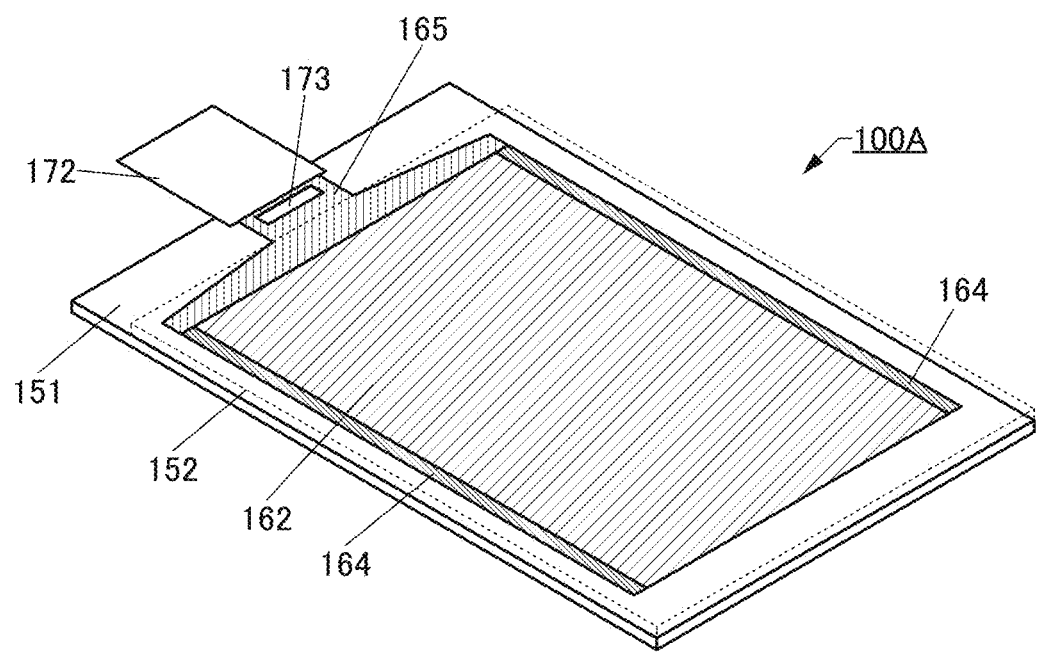
FIG. 14 is a perspective view showing an example of a display device.
Figure 15:
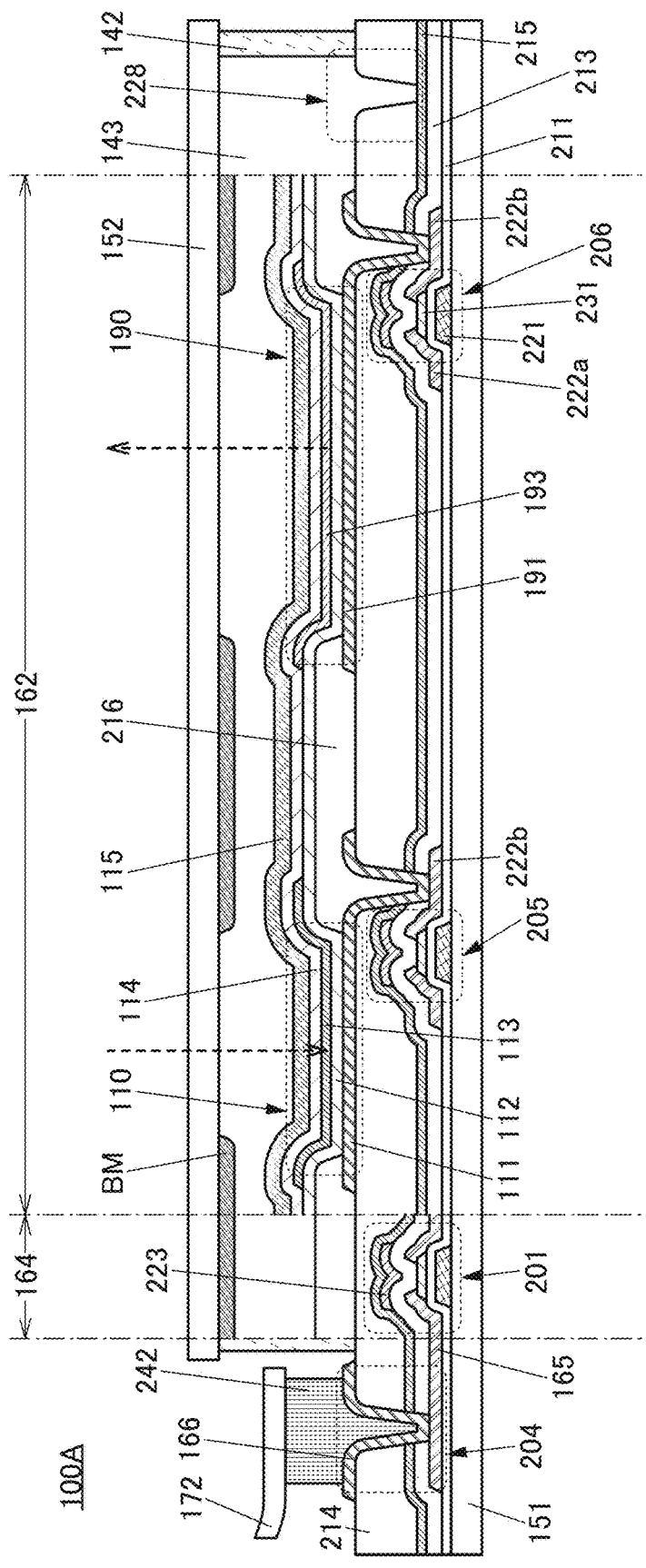
FIG. 15 is a cross-sectional view showing an example of a display device.

FIG. 14 shows a perspective view of a display device 100A, and FIG. 15 shows a cross-sectional view of the display device 100A.

The display device 100A has a structure in which the substrate 152 and the substrate 151 are bonded to each other. In FIG. 14, the substrate 152 is denoted by a dashed line.

The display device 100A includes a display portion 162, a circuit 164, a wiring 165, and the like. FIG. 14 shows an example in which the display device 100A is provided with an IC (integrated circuit) 173 and an FPC 172. Thus, the structure illustrated in FIG. 14 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 14 shows an example in which the IC 173 is provided on the substrate 151 by a COG (Chip On Glass) method or the like. An IC including a scan line driver circuit, a signal line driver circuit, or the like can be used as the IC 173, for example. Note that the display device 100A and the display module may have a structure that is not provided with an IC. The IC may be provided over the FPC by a COF method or the like.

FIG. 15 shows an example of cross sections of part of a region including the FPC 172, part of a region including the circuit 164, part of a region including the display portion 162, and part of a region including an end portion of the display device 100A illustrated in FIG. 14.

The display device 100A illustrated in FIG. 15 includes a transistor 201, a transistor 205, a transistor 206, the light-emitting element 190, the light-receiving element 110, and the like between the substrate 151 and the substrate 152.

The substrate 152 and the insulating layer 214 are bonded to each other with the adhesive layer 142. A solid sealing structure, a hollow sealing structure, or the like can be employed to seal the light-emitting element 190 and the light-receiving element 110. In FIG. 15, a hollow sealing structure is employed in which a space 143 surrounded by the substrate 152, the adhesive layer 142, and the insulating layer 214 is filled with an inert gas (e.g., nitrogen or argon). The adhesive layer 142 may be provided to overlap with the light-emitting element 190. The space 143 surrounded by the substrate 152, the adhesive layer 142, and the insulating layer 214 may be filled with a resin different from that of the adhesive layer 142.

The light-emitting element 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 206 through an opening provided in the insulating layer 214. The transistor 206 has a function of controlling the driving of the light-emitting element 190. An end portion of the pixel electrode 191 is covered with the partition wall 216. The pixel electrode 191 includes a material that reflects visible light, and the common electrode 115 includes a material that transmits visible light.

The light-receiving element 110 has a stacked-layer structure in which the pixel electrode 111, the common layer 112, the active layer 113, the common layer 114, and the common electrode 115 are stacked in that order from the insulating layer 214 side. The pixel electrode 111 is electrically connected to the conductive layer 222b included in the transistor 205 through an opening provided in the insulating layer 214. An end portion of the pixel electrode 111 is covered with the partition wall 216. The pixel electrode 111 includes a material that reflects visible light, and the common electrode 115 includes a material that transmits visible light.

Light emitted from the light-emitting element 190 is emitted to the substrate 152 side. Light enters the light-receiving element 110 through the substrate 152 and the space 143. For the substrate 152, a material having a high visible-light-transmitting property is preferably used.

The pixel electrode 111 and the pixel electrode 191 can be formed using the same material in the same step. The common layer 112, the common layer 114, and the common electrode 115 are used in both the light-receiving element 110 and the light-emitting element 190. The light-receiving element 110 and the light-emitting element 190 can have common components except the active layer 113 and the light-emitting layer 193. Thus, the light-receiving element 110 can be incorporated into the display device 100A without a significant increase in the number of manufacturing steps.

The light-blocking layer BM is provided on a surface of the substrate 152 on the substrate 151 side. The light-blocking layer BM has openings at a position overlapping with the light-receiving element 110 and an opening at a position overlapping with the light-emitting element 190. Providing the light-blocking layer BM can control the range where the light-receiving element 110 senses light. Furthermore, with the light-blocking layer BM, light can be prevented from directly entering the light-receiving element 110 from the light-emitting element 190 without through an object. Hence, a sensor with less noise and high sensitivity can be obtained.

The transistor 201, the transistor 205, and the transistor 206 are formed over the substrate 151. These transistors can be fabricated using the same material in the same process.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, such an insulating layer can serve as a barrier layer. Such a structure can effectively inhibit diffusion of impurities into the transistors from the outside and increase the reliability of a display device.

An inorganic insulating film is preferably used as each of the insulating layer 211, the insulating layer 213, and the insulating layer 215. As the inorganic insulating film, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that an end portion of the organic insulating film is positioned on the inner side compared to the end portion of the display device 100A, to prevent the organic insulating film from being exposed at the end portion of the display device 100A.

An organic insulating film is suitable for the insulating layer 214 functioning as a planarization layer. Other examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 15, an opening is formed in the insulating layer 214. This can inhibit entry of impurities into the display portion 162 from the outside through the insulating layer 214 even when an organic insulating film is used as the insulating layer 214. Thus, the reliability of the display device 100A can be increased.

Each of the transistor 201, the transistor 205, and the transistor 206 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or bottom-gate transistor structure may be employed. Alternatively, gates may be provided above and below a semiconductor layer where a channel is formed.

The structure in which the semiconductor layer where a channel is formed is provided between two gates is used for the transistor 201, the transistor 205, and the transistor 206. The two gates may be connected to each other and supplied with the same signal to operate the transistor. Alternatively, by supplying a potential for controlling the threshold voltage to one of the two gates and a potential for driving to the other, the threshold voltage of the transistor may be controlled.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, a single-crystal semiconductor, or a semiconductor partly including crystal regions) may be used. It is preferable that a single crystal semiconductor or a semiconductor having crystallinity be used, in which case deterioration of the transistor characteristics can be suppressed.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, =2:1:3, In:M:Zn=3:1:2, In:M:Zn=4:2:3, InM:Zn=4:2:4.1, In:M:Zn=5:1:6, In:M:Zn=5:1:7, =5:1:8, InM:Zn=6:1:6, and In:M:Zn=5:2:5.

A target containing a polycrystalline oxide is preferably used as the sputtering target, in which case the semiconductor layer having crystallinity is easily formed. Note that the atomic ratio between metal elements in the deposited semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be deposited is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In to the number of metal elements being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In to the number of metal elements being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In to the number of metal elements being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 not overlapping with the substrate 152. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorption layer, or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting element 190 may be a top emission, bottom emission, or dual emission light-emitting element, or the like. A conductive film that transmits visible light is used as the electrode through which light is extracted. A conductive film that reflects visible light is preferably used as the electrode through which no light is extracted.

The light-emitting element 190 includes at least the light-emitting layer 193. In addition to the light-emitting layer 193, the light-emitting element 190 may further include a layer containing a substance with a high hole-injection property, a layer containing a substance with a high hole-transport property, a layer containing a hole-blocking material, a layer containing a substance with a high electron-transport property, a layer containing a substance with a high electron-injection property, a layer containing a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114, and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 113 of the light-receiving element 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting element 190 and the active layer 113 of the light-receiving element 110 can be formed by the same method (e.g., a vacuum evaporation method) and thus the same manufacturing apparatus can be used.

Examples of an n-type semiconductor material included in the active layer 113 are electron-accepting organic semiconductor materials such as fullerene (e.g., $C_{60}$ and $C_{70}$) and derivatives thereof. As a p-type semiconductor material contained in the active layer 113, an electron-donating organic semiconductor material such as copper(II) phthalocyanine (CuPc) or tetraphenyldibenzoperiflanthene (DBP) can be given.

For example, the active layer 113 is preferably formed by co-evaporation of an n-type semiconductor and a p-type semiconductor.

As materials for a conductive layer such as a wiring or an electrode that forms a display device in addition to a gate, a source, and a drain of a transistor, metals such as aluminum, titanium, chromium, nickel, copper, yttrium, zirconium, molybdenum, silver, tantalum, and tungsten, or an alloy containing any of these metals as its main component can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers such as a variety of wirings and electrodes that constitute a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 100B]

FIG. 16A shows a cross-sectional view of a display device 100B.

The display device 100B is different from the display device 100A mainly in that the lens 149 and the protective layer 195 are included.

Providing the protective layer 195 covering the light-receiving element 110 and the light-emitting element 190 can inhibit entry of impurities such as water into the light-receiving element 110 and the light-emitting element 190, so that the reliability of the light-receiving element 110 and the light-emitting element 190 can be increased.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display device 100B can be increased.

FIG. 16B shows an example in which the protective layer 195 has a three-layer structure. In FIG. 16B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, whereby the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on the surface of the substrate 152 on the substrate 151 side. The lens 149 has the convex surface on the substrate 151 side. It is preferable that the light-receiving region of the light-receiving element 110 overlap with the lens 149 and do not overlap with the light-emitting layer 193. Thus, the sensitivity and accuracy of the sensor using the light-receiving element 110 can be increased.

The lens 149 preferably has a refractive index of greater than or equal to 1.3 and less than or equal to 2.5. The lens 149 can be formed using at least one of an inorganic material or an organic material. For example, a material containing a resin can be used for the lens 149. In addition, a material including an oxide or a sulfide can be used for the lens 149.

Specifically, a resin containing chlorine, bromine, or iodine, a resin containing a heavy metal atom, a resin having an aromatic ring, a resin containing sulfur, or the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, or the like can be used for the lens 149. Alternatively, zinc sulfide or the like can be used for the lens 149.

In the display device 100B, the protective layer 195 and the substrate 152 are bonded to each other with the adhesive layer 142. The adhesive layer 142 is provided to overlap with the light-receiving element 110 and the light-emitting element 190; that is, the display device 100B employs a solid sealing structure.

[Display Device 100C]

Figure 17A:
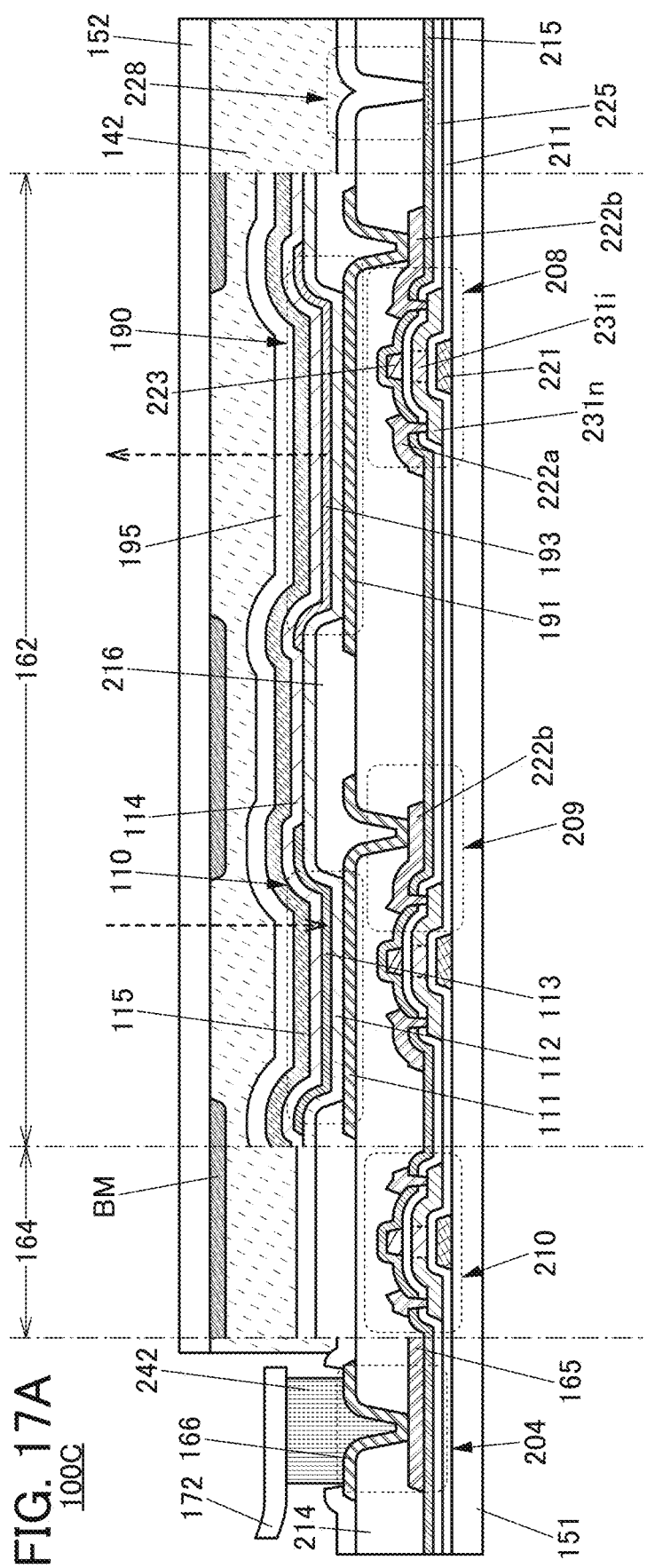
FIG. 17A and FIG. 17B are cross-sectional views showing an example of a display device.

FIG. 17A shows a cross-sectional view of a display device 100C.

The display device 100C is different from the display device 100B in the structure of the transistor.

The display device 100C includes a transistor 208, a transistor 209, and a transistor 210 over the substrate 151.

Each of the transistor 208, the transistor 209, and the transistor and 210 includes the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the low-resistance regions 231*n*, the conductive layer 222*b* connected to the other low-resistance region 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are each connected to the corresponding low-resistance region 231*n* through openings provided in the insulating layer 225 and the insulating layer 215. One of the conductive layer 222*a* and the conductive layer 222*b* serves as a source, and the other serves as a drain.

The pixel electrode 191 of the light-emitting element 190 is electrically connected to one of the pair of low-resistance regions 231*n* of the transistor 208 through the conductive layer 222*b*.

The pixel electrode 111 of the light-receiving element 110 is electrically connected to the other of the pair of low-resistance regions 231*n* of the transistor 209 through the conductive layer 222*b*.

Figure 17B:
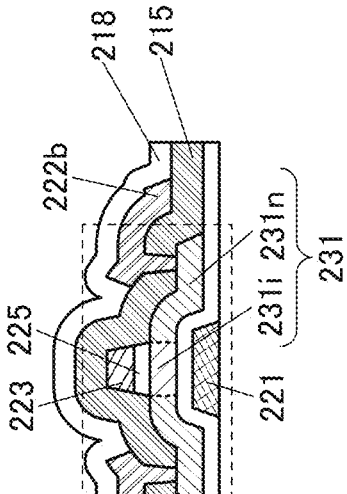

FIG. 17A shows an example in which the insulating layer 225 covers a top surface and a side surface of the semiconductor layer. Meanwhile, in FIG. 17B, the insulating layer 225 overlaps with the channel formation region 231*i* of the semiconductor layer 231 and does not overlap with the low-resistance regions 231*n*. The structure illustrated in FIG. 17B is obtained by processing the insulating layer 225 with the conductive layer 223 as a mask, for example. In FIG. 17B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

[Display Device 100D]

Figure 18:
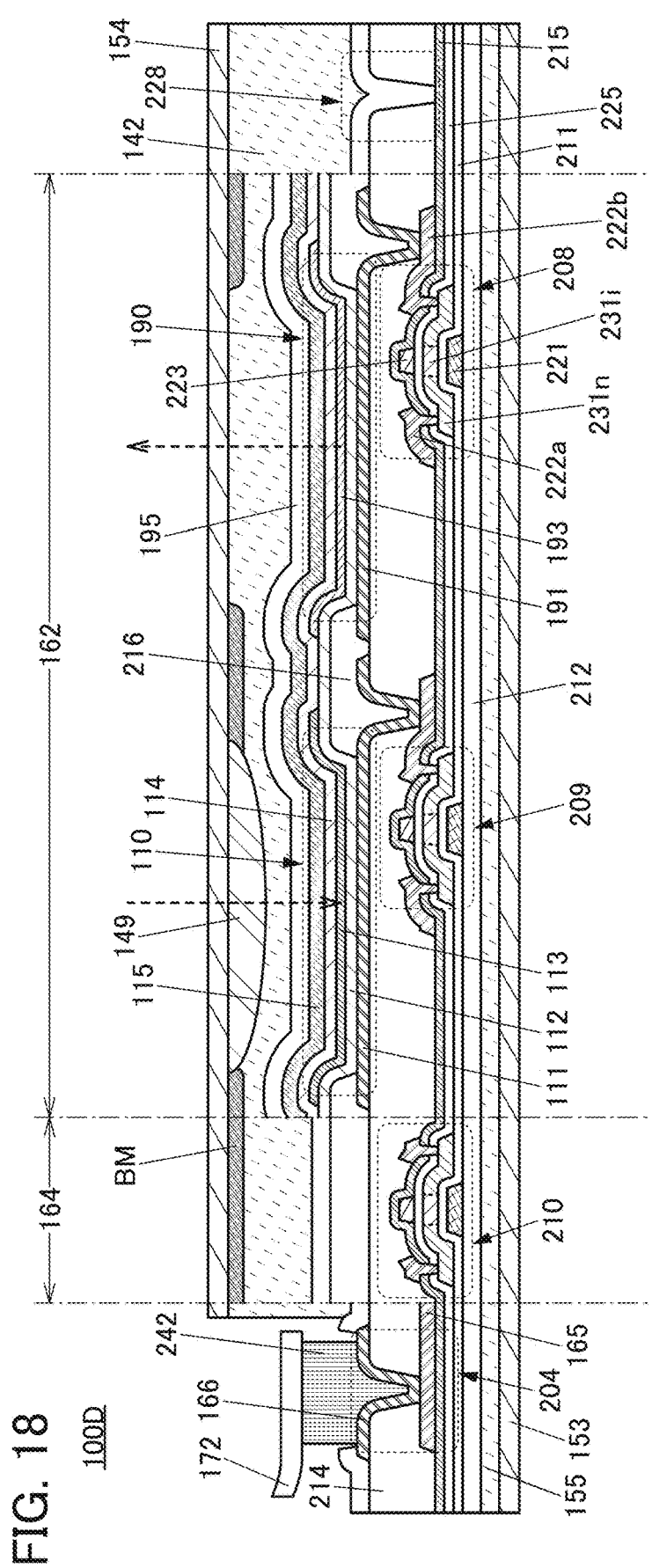
FIG. 18 is a cross-sectional view showing an example of a display device.

FIG. 18 shows a cross-sectional view of a display device 100D.

The display device 100D differs from the display device 100C mainly in that the substrate 151 and the substrate 152 are not included, the substrate 153, the substrate 154, the adhesive layer 155, and the insulating layer 212 are included, and the lens 149 is included.

The substrate 153 and the insulating layer 212 are bonded to each other with the adhesive layer 155. The substrate 154 and the protective layer 195 are bonded to each other with the adhesive layer 142.

The display device 100D is formed in such a manner that the insulating layer 212, the transistor 208, the transistor 209, the light-receiving element 110, the light-emitting element 190, and the like that are formed over a formation substrate are transferred onto the substrate 153. The substrate 153 and the substrate 154 are preferably flexible. Accordingly, the flexibility of the display device 100D can be increased.

The inorganic insulating film that can be used as the insulating layer 211, the insulating layer 213, and the insulating layer 215 can be used as the insulating layer 212.

The display device 100C shows an example in which the lens 149 is not included, and the display device 100D shows an example in which the lens 149 is included. The lens 149 can be provided as appropriate depending on the usage of a sensor or the like.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, the display device of this embodiment includes a light-receiving element and a light-emitting element in a display portion, and the display portion has both a function of displaying an image and a function of sensing light. Thus, the size and weight of an electronic device can be reduced as compared to the case where a sensor is provided outside a display portion or outside a display device. Moreover, an electronic device having more functions can be obtained by a combination of the display device of this embodiment and a sensor provided outside the display portion or outside the display device.

In the light-receiving element, at least one of the layers other than the active layer can be common to the layer in the light-emitting element (the EL element). Furthermore, in the light-receiving element, all the layers other than the active layer can be common to the layers in the light-emitting element (the EL element). With only the addition of the step of depositing the active layer to the manufacturing process of the light-emitting element, the light-emitting element and the light-receiving element can be formed over one substrate, for example. In the light-receiving element and the light-emitting element, their pixel electrodes can be formed using the same material in the same step, and their common electrodes can be formed using the same material in the same step. When a circuit electrically connected to the light-receiving element and a circuit electrically connected to the light-emitting element are formed using the same material in the same process, the manufacturing process of the display device can be simplified. In such a manner, a display device that incorporates a light-receiving element and is highly convenient can be manufactured without complicated steps.

The display device of this embodiment includes a coloring layer between the light-receiving element and the light-emitting element. A partition wall that electrically insulates the light-receiving element and the light-emitting element may also function as the coloring layer. The coloring layer can absorb stray light in the display device, which increases the sensitivity of a sensor using the light-receiving element.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device of one embodiment of the present invention will be described with reference to FIG. 19.

The display device of one embodiment of the present invention includes first pixel circuits including a light-receiving element and second pixel circuits including a light-emitting element. The first pixel circuits and the second pixel circuits are arranged in a matrix.

Figure 19A:
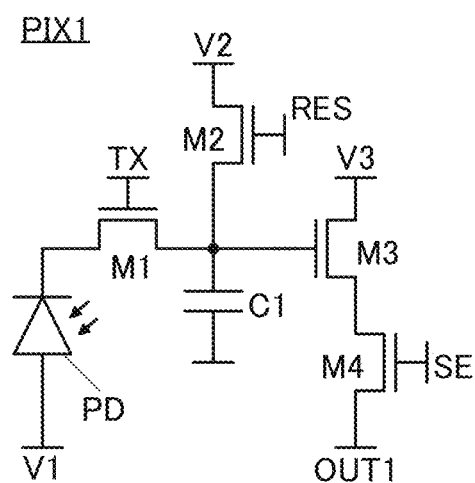
FIG. 19A and FIG. 19B are circuit diagrams showing examples of a pixel circuit.
Figure 19B:
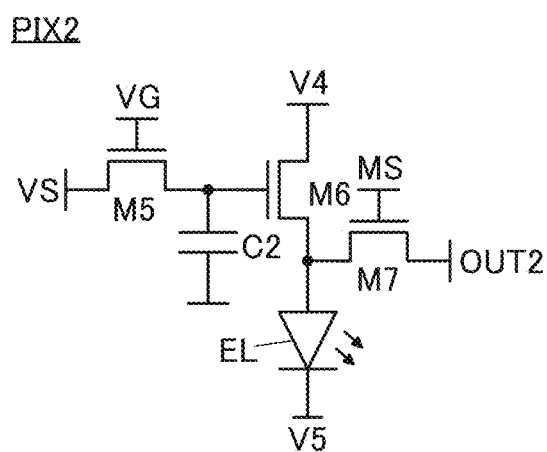

FIG. 19A shows an example of the first pixel circuit including a light-receiving element, and FIG. 19B shows an example of the second pixel circuit including a light-emitting element.

A pixel circuit PIX1 illustrated in FIG. 19A includes a light-receiving element PD, a transistor M1, a transistor M2, a transistor M3, a transistor M4, and a capacitor C1. Here, a photodiode is used as an example of the light-receiving element PD.

An anode of the light-receiving element PD is electrically connected to a wiring V1, and a cathode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential is supplied to the wiring V1, the wiring V2, and the wiring V3. When the light-receiving element PD is driven with a reverse bias, the wiring V2 is supplied with a potential higher than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for outputting a signal corresponding to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 19B includes a light-emitting element EL, a transistor M5, a transistor M6, a transistor M7, and a capacitor C2. Here, a light-emitting diode is used as an example of the light-emitting element EL. In particular, an organic EL element is preferably used as the light-emitting element EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other is electrically connected to an anode of the light-emitting element EL and one of a source and a drain of the transistor M7. A gate of the transistor M7 is electrically connected to a wiring M5, and the other of the source and the drain is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL in accordance with a potential supplied to the gate. When the transistor M5 is in an on state, a potential supplied to the wiring VS is supplied to the gate of the transistor M6, and the luminance of the light-emitting element EL can be controlled in accordance with the potential. The transistor M7 is controlled by a signal supplied to the wiring M5 and has a function of outputting a potential between the transistor M6 and the light-emitting element EL to the outside through the wiring OUT2.

Note that in the display device of this embodiment, the light-emitting element may be made to emit light in a pulsed manner so as to display an image. A reduction in the driving time of the light-emitting element can reduce power consumption of the display device and suppress heat generation. An organic EL element is particularly preferable because of its favorable frequency characteristics. The frequency can be 1 kHz to 100 MHz, for example.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Such a low off-state current enables retention of charges accumulated in a capacitor that is connected in series with the transistor for a long time. Therefore, it is particularly preferable to use a transistor including an oxide semiconductor as the transistor M1, the transistor M2, and the transistor M5 each of which is connected in series with the capacitor C1 or the capacitor C2. Moreover, the use of transistors including an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor including an oxide semiconductor may be used as at least one of the transistor M1 to the transistor M7, and transistors including silicon may be used as the other transistors.

Although the transistors are illustrated as n-channel transistors in FIG. 19A and FIG. 19B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided to overlap with the light-receiving element PD or the light-emitting element EL. Thus, the effective area of each pixel circuit can be reduced, and a high-definition light-receiving portion or display portion can be achieved.

At least part of this embodiment can be implemented in combination with any of the other embodiments described in this specification as appropriate.

Embodiment 4

In this embodiment, electronic devices of one embodiments of the present invention will be described with reference to FIG. 20 to FIG. 22.

An electronic device of this embodiment includes the display device of one embodiment of the present invention. The display device of one embodiment of the present invention can be used as a display portion of the electronic device. The display device of one embodiment of the present invention has a function of sensing light, and thus can perform biological authentication with the display portion or detect a touch or a near touch on the display portion. Accordingly, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 20A:
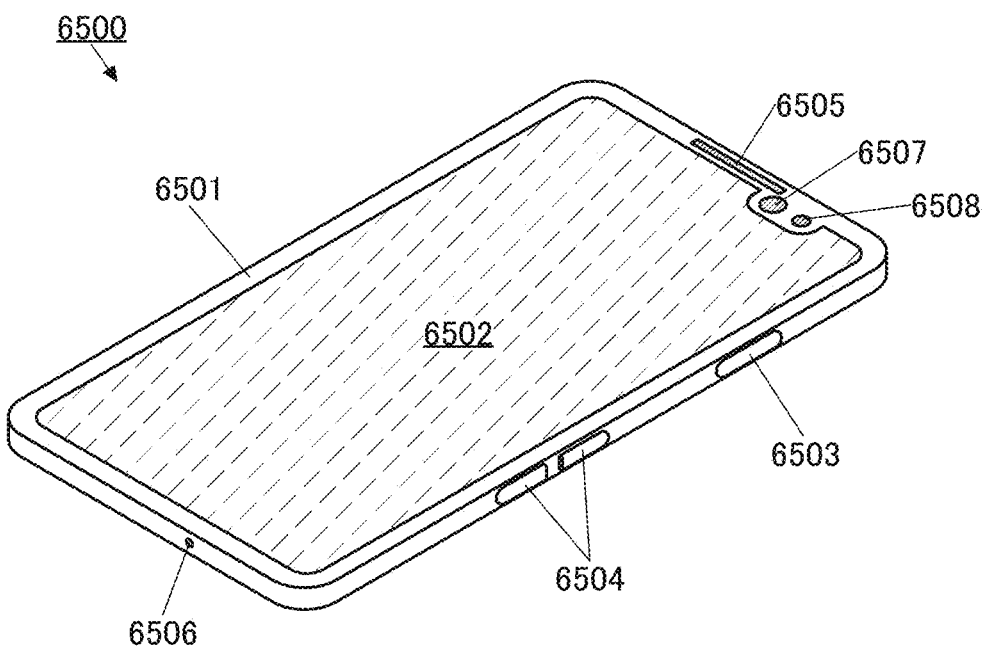
FIG. 20A and FIG. 20B are diagrams showing an example of an electronic device.

An electronic device 6500 in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 20B:
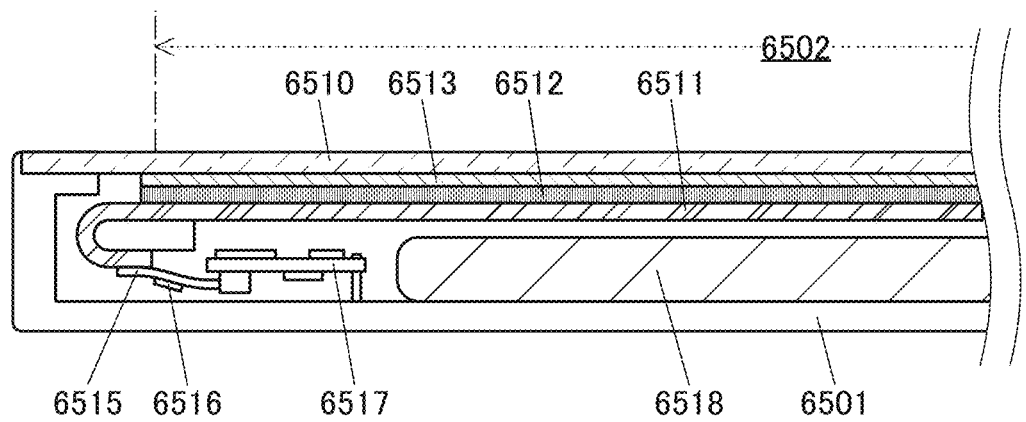

FIG. 20B is a schematic cross-sectional view including an end portion of the housing 6501 on the microphone 6506 side.

A protective component 6510 that transmits light is provided on the display surface side of the housing 6501, and a display panel 6511, an optical component 6512, a touch sensor panel 6513, a printed circuit board 6517, a battery 6518, and the like are provided in a space surrounded by the housing 6501 and the protective component 6510.

The display panel 6511, the optical component 6512, and the touch sensor panel 6513 are fixed to the protective component 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 21A:
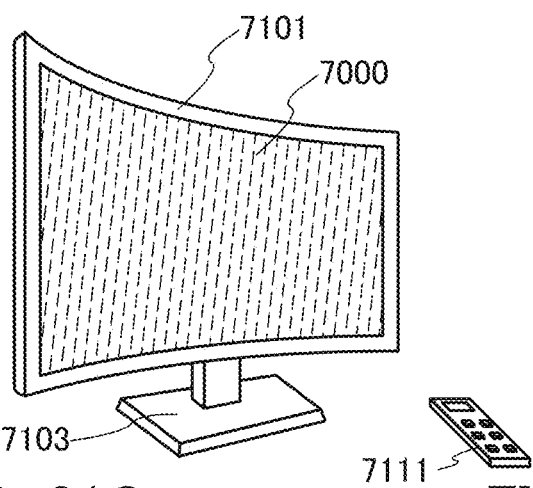
FIG. 21A to FIG. 21D are diagrams showing examples of an electronic device.

FIG. 21A shows an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

The television device 7100 illustrated in FIG. 21A can be operated with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may be provided with a display portion for displaying information output from the remote controller 7111. With a touch panel or operation keys provided in the remote controller 7111, channels and volume can be controlled, and videos displayed on the display portion 7000 can be controlled.

Note that the television device 7100 is provided with a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 21B:
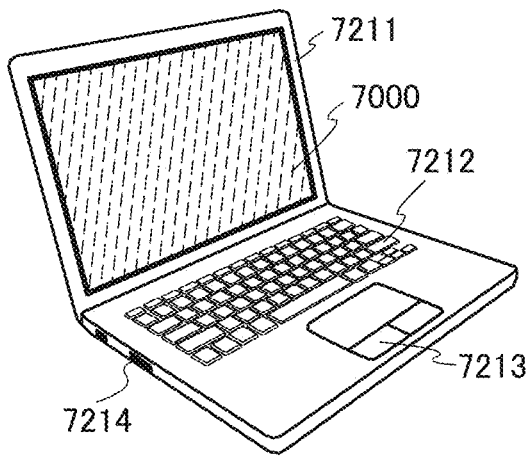

FIG. 21B shows an example of a laptop personal computer. A laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

Figure 21C:
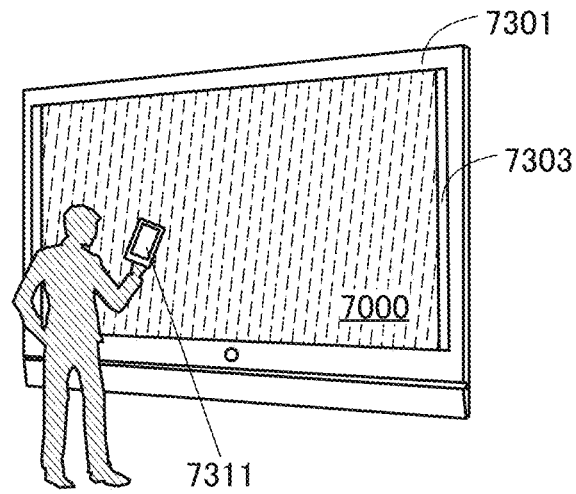
Figure 21D:
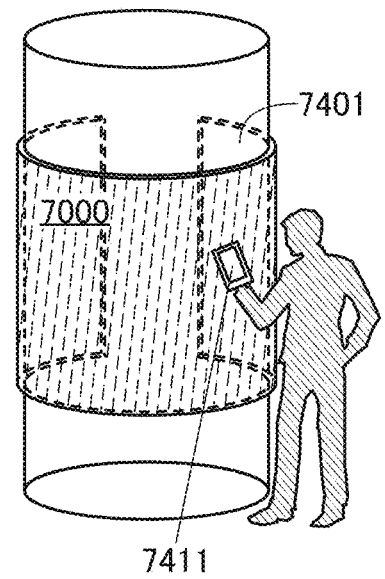

FIG. 21C and FIG. 21D show examples of digital signage. Digital signage 7300 illustrated in FIG. 21C includes a housing 7301, the display portion 7000, a speaker 7303, and the like. Furthermore, an LED lamp, operation keys (including a power switch or an operation switch), a connection terminal, a variety of sensors, a microphone, and the like can be included.

FIG. 21D illustrates digital signage 7400 mounted on a cylindrical pillar 7401. The digital signage 7400 includes the display portion 7000 provided along a curved surface of the pillar 7401.

The display device of one embodiment of the present invention can be used in the display portion 7000 illustrated in each of FIG. 21C and FIG. 21D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

It is preferable that the digital signage 7300 or the digital signage 7400 work with an information terminal 7311 or an information terminal 7411 such as a user's smartphone through wireless communication, as illustrated in FIG. 21C and FIG. 21D. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 22A to FIG. 22F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 22A to FIG. 22F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIG. 22A to FIG. 22F are described in detail below.

Figure 22A:
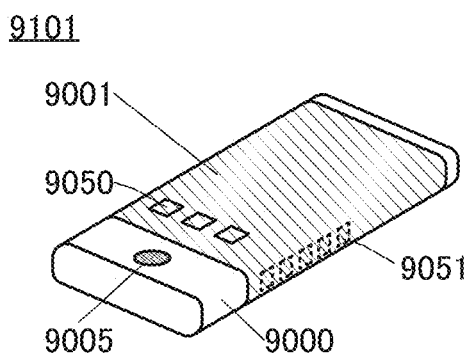
FIG. 22A to FIG. 22F are diagrams showing examples of an electronic device.

FIG. 22A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display text and image information on its plurality of surfaces. FIG. 22A shows an example in which three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 22B:
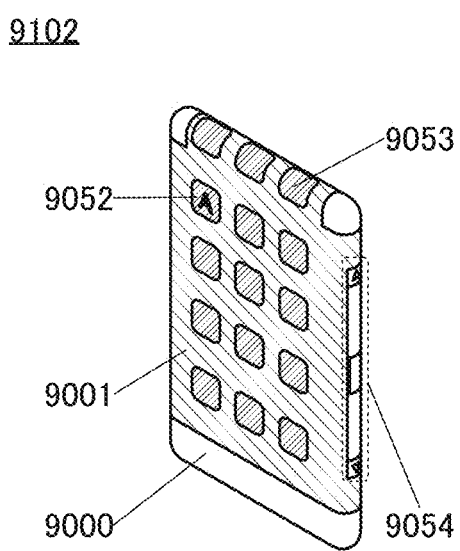

FIG. 22B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 22C:
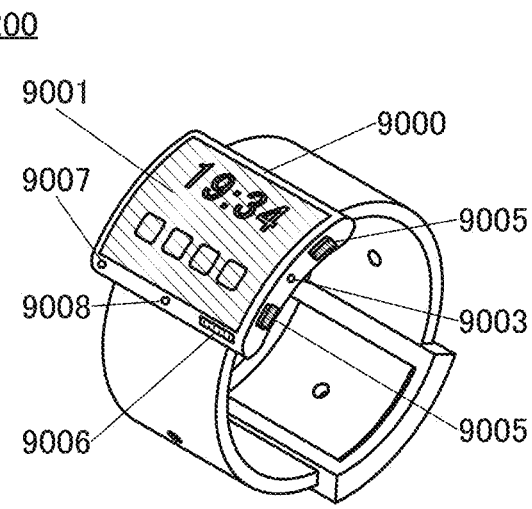

FIG. 22C is a perspective view illustrating a watch-type portable information terminal 9200. For example, the portable information terminal 9200 can be used as a smart watch. A display surface of the display portion 9001 is curved, and display can be performed along the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 22D:
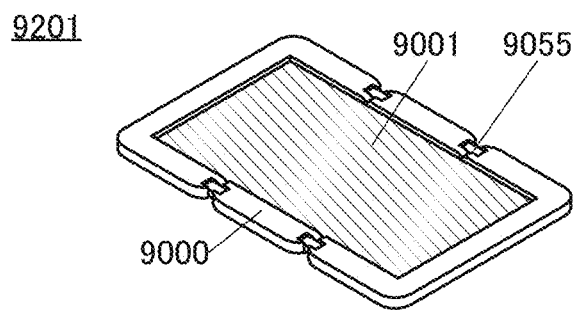
Figure 22E:
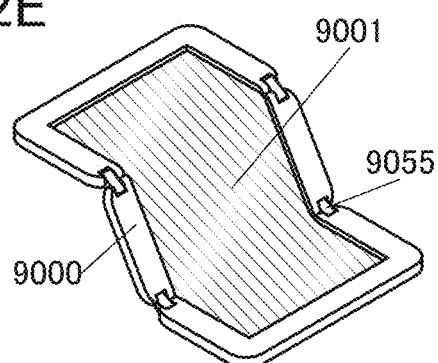
Figure 22F:
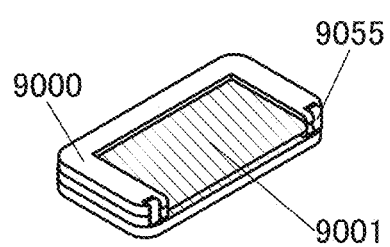

FIG. 22D to FIG. 22F are perspective views illustrating a foldable portable information terminal 9201. FIG. 22D is a perspective view of an opened state of the portable information terminal 9201, FIG. 22F is a perspective view of a folded state thereof, and FIG. 22E is a perspective view of a state in the middle of change from one of FIG. 22D and FIG. 22F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

EXAMPLE

In this example, results of image processing performed by the image processing method of one embodiment of the present invention will be described.

Figure 23A:
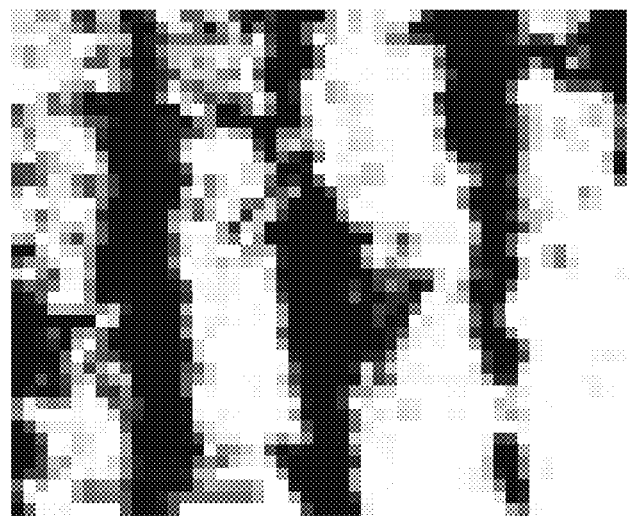
FIG. 23A to FIG. 23C are image data according to Example.

FIG. 23A shows an original image of part of a fingerprint. Image data of the original image shown in FIG. 23A has an image size of 51×43 pixels and is monochromatic gray-scale bitmap data having 8-bit (256) gray levels per pixel.

Next, virtually-blurred image data is generated from the image data of the original image described above. Specifically, image data was generated so that the gray level value of one pixel is a gray level value obtained by adding the gray level values of 3×3 pixels including the one pixel as the center. This processing corresponds to the case where the area of the imaging region of one imaging element is three times the pixel pitch in the imaging module described in Embodiment 1 as an example.

Figure 23B:
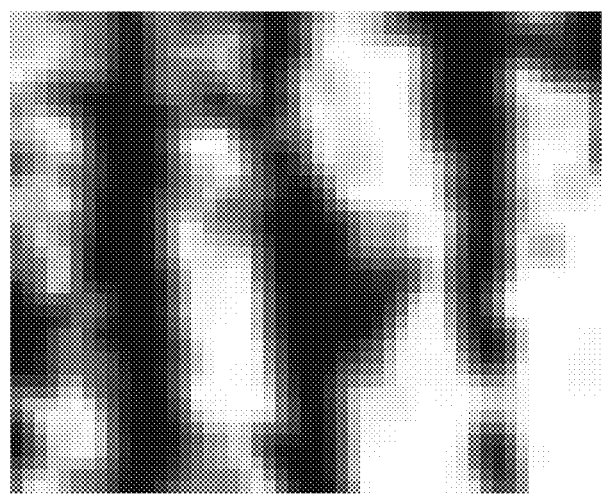

FIG. 23B shows an image of the processed image data. Here, the image of the image data that is downconverted so that the gray level value of each pixel is 8 bits is shown. As shown in FIG. 23B, the image having a more blurred outline and a lower contrast than the original image was obtained.

Then, image processing was performed on FIG. 23B by the method described in Example 2 of Embodiment 1 as an example. Here, gray level values are supplied as initial values to pixels in upper three columns and left three columns of the image data of the original image shown in FIG. 23A, whereby the gray level values of residual pixels were inductively determined.

Figure 23C:
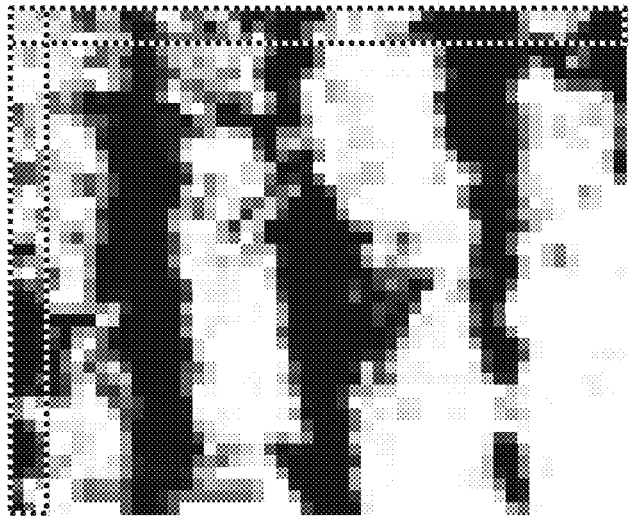

FIG. 23C shows an image of the image data after the image processing. Note that the pixels in upper three columns and left three columns surrounded by dashed lines in FIG. 23C are parts of the original image in FIG. 23A supplied as initial values. As shown in FIG. 23C, an image of a region other than the range surrounded by the dashed lines is almost the same as FIG. 23A which is an original image, indicating that the image is correctly recovered.

As described above, it was confirmed that a blurred image can be sharpened by employing the image processing method of one embodiment of the present invention.

REFERENCE NUMERALS

IS: imaging module, $D_0$, $D_1$: image, $P_i$, $P_{ij}$: imaging element, $A_i$, $A_{ij}$: region, $S_i$, $S_{ij}$: region, $X_i$, $X_{ij}$: region, $Y_i$, $Y_{ij}$: region, $W_P$: pitch, $W_A$: width, 800: imaging device, 801: imaging portion, 802: control portion, 803: memory portion, 804: program, 805: output portion

The invention claimed is:

1. An image processing method of image data in which a plurality of pixels are arranged,
   wherein adjacent two pixels are each divided into a first region showing the same pixel value between the adjacent two pixels and a second region other than the first region,
   wherein an initial value is supplied to the second region of an endmost pixel of the image data, and
   wherein pixel values of the first regions and the second regions of the plurality of arranged pixels are determined inductively and sequentially on the basis of the initial value.

2. An image processing method of image data in which a plurality of pixels are arranged in a matrix,
wherein 2×2 pixels are each divided into a first region showing the same pixel value as a pixel value of an adjacent pixel and a second region other than the first region,
wherein initial values are supplied to the second regions of three outermost pixels of 2×2 endmost pixels of the image data, and pixel values of the first region and the second region of one residual pixel are determined on the basis of the initial values, and
wherein pixel values of the first regions and the second regions of the plurality of arranged pixels are determined inductively and sequentially on the basis of the determined pixel values of the first region and the second region.

3. An image processing method of image data in which a plurality of pixels are arranged,
wherein the image data comprises an endmost first pixel comprising a first pixel value and a second pixel adjacent to the first pixel and comprising a second pixel value,
wherein the first pixel is divided into a first region comprising a third pixel value and a second region comprising a fourth pixel value,
wherein the second pixel is divided into a third region comprising a fifth pixel value and the second region, and
wherein an initial value is applied to the third pixel value, whereby the fifth pixel value is determined using the first pixel value, the second pixel value, and the third pixel value.

4. The image processing method according to claim 3,
wherein the image data comprises a third pixel adjacent to the second pixel and comprising a sixth pixel value,
wherein the second pixel is divided into a fourth region comprising a seventh pixel value and a fifth region comprising an eighth pixel value,
wherein the third pixel is divided into a sixth region comprising a ninth pixel value and the fifth region,
wherein the fourth pixel value is determined using the first pixel value, the second pixel value, and the third pixel value, and
wherein the ninth pixel value is determined using the second pixel value, the fourth pixel value, the fifth pixel value, and the sixth pixel value.

5. A program for making a computer to execute
a step of reading out image data in which a plurality of pixels are arranged,
a step of dividing each of adjacent two pixels into a first region showing the same pixel value between the adjacent two pixels and a second region other than the first region,
a step of supplying an initial value to the second region of an endmost pixel of the image data, and
a step of inductively and sequentially determining pixel values of the first regions and the second regions of the plurality of arranged pixels on the basis of the initial value.

6. An imaging device comprising:
a memory portion storing the program according to claim 5;
a control portion for executing the program; and
an imaging portion for obtaining the image data,
wherein the imaging portion comprises a plurality of pixel circuits for obtaining pixel values corresponding to pixels, and
wherein imaging ranges of two adjacent pixel circuits among the plurality of pixel circuits partly overlap with each other.

7. A program for making a computer to execute
a step of reading out image data in which a plurality of pixels are arranged in a matrix,
a step of dividing each of 2×2 pixels into a first region showing the same pixel value as a pixel value of an adjacent pixel and a second region other than the first region,
a step of supplying initial values to the second regions of three outermost pixels of 2×2 endmost pixels of the image data,
a step of determining pixel values of the first region and the second region of one residual pixel on the basis of the initial values, and
a step of inductively and sequentially determining pixel values of the first regions and the second regions of the plurality of arranged pixels on the basis of the determined pixel values of the first region and the second region.

8. An imaging device comprising:
a memory portion storing the program according to claim 7;
a control portion for executing the program; and
an imaging portion for obtaining the image data,
wherein the imaging portion comprises a plurality of pixel circuits for obtaining pixel values corresponding to pixels, and
wherein imaging ranges of two adjacent pixel circuits among the plurality of pixel circuits partly overlap with each other.

9. A program for making a computer to execute
a step of reading out image data in which a plurality of pixels are arranged, and the image data comprises an endmost first pixel comprising a first pixel value and a second pixel adjacent to the first pixel and comprising a second pixel value,
a step of dividing the first pixel into a first region comprising a third pixel value and a second region comprising a fourth pixel value,
a step of dividing wherein the second pixel is divided into a third region comprising a fifth pixel value and the second region,
a step of applying an initial value to the third pixel value, and
a step of determining the fifth pixel value from the first pixel value, the second pixel value, and the third pixel value.

10. The program according to claim 9, in which the image data comprises a third pixel adjacent to the second pixel and comprising a sixth pixel value, further comprising:
a step of dividing the second pixel into a fourth region comprising a seventh pixel value and a fifth region comprising an eighth pixel value;
a step of dividing the third pixel into a sixth region comprising a ninth pixel value and the fifth region;
a step of determining the fourth pixel value from the first pixel value, the second pixel value, and the third pixel value; and
a step of determining the ninth pixel value from the second pixel value, the fourth pixel value, the fifth pixel value, and the sixth pixel value.

11. An imaging device comprising:
a memory portion storing the program according to claim 10;
a control portion for executing the program; and an imaging portion for obtaining the image data, wherein the imaging portion comprises a plurality of pixel circuits for obtaining pixel values corresponding to pixels, and wherein imaging ranges of two adjacent pixel circuits among the plurality of pixel circuits partly overlap with each other.

12. An imaging device comprising:

a memory portion storing the program according to claim 9;

a control portion for executing the program; and an imaging portion for obtaining the image data, wherein the imaging portion comprises a plurality of pixel circuits for obtaining pixel values corresponding to pixels, and wherein imaging ranges of two adjacent pixel circuits among the plurality of pixel circuits partly overlap with each other.

* * * * *